(12) United States Patent
Kapoor

(10) Patent No.: US 7,474,125 B2
(45) Date of Patent: Jan. 6, 2009

(54) METHOD OF PRODUCING AND OPERATING A LOW POWER JUNCTION FIELD EFFECT TRANSISTOR

(75) Inventor: Ashok Kumar Kapoor, Palo Alto, CA (US)

(73) Assignee: DSM Solutions, Inc., Los Gatos, CA (US)

( * ) Notice: Subject to any disclaimer, the term of this patent is extended or adjusted under 35 U.S.C. 154(b) by 5 days.

(21) Appl. No.: 11/635,004

(22) Filed: Dec. 7, 2006

(65) Prior Publication Data

US 2007/0126478 A1 Jun. 7, 2007

Related U.S. Application Data

(60) Provisional application No. 60/748,089, filed on Dec. 7, 2005.

(51) Int. Cl.
*H03K 19/20* (2006.01)
*H03K 19/094* (2006.01)

(52) U.S. Cl. .................. 326/112; 326/104; 326/101; 326/102

(58) Field of Classification Search .............. 326/104, 326/112, 119, 122; 327/430
See application file for complete search history.

(56) References Cited

U.S. PATENT DOCUMENTS

| 4,038,563 | A | * | 7/1977 | Zuleeg et al. ............... 326/112 |
| 4,700,461 | A | * | 10/1987 | Choi et al. .................. 438/149 |
| 6,307,223 | B1 | | 10/2001 | Yu |
| 6,496,034 | B2 | | 12/2002 | Forbes et al. |

OTHER PUBLICATIONS

PCT Notification of The International Search Report and Written Opinion; PCT/US06/46666; dated Feb. 19, 2008, 9 pages.
Wilson, et al., "Process Optimization of High Performance Ion Implanted GaAs JFET's", 1992 IEEE, GaAs IC Symposium, pp. 169-173.

* cited by examiner

*Primary Examiner*—Anh Q Tran
(74) *Attorney, Agent, or Firm*—Baker Botts L.L.P.

(57) ABSTRACT

A method for using an inverter with a pair of complementary junction field effect transistors (CJFET) with a small linewidth is provided. The method includes having an input capacitance for said CJFET inverter to be less than the corresponding input capacitance of a CMOS inverter of similar linewidth. The CJFET operates at a power supply with a lesser value than the voltage drop across a forward-biased diode having a reduced switching power as compared to said CMOS inverter and having a propagation delay for said CJFET inverter that is at least comparable to the corresponding delay of said CMOS inverter.

16 Claims, 38 Drawing Sheets

| STI | 350nm |
| Nwell | 400nm |
| Pwell | 800nm |
| Dnwell | 1200nm |

METHOD OF PRODUCING AND OPERATING A LOW POWER JUNCTION FIELD EFFECT TRANSISTOR

CROSS-REFERENCE TO RELATED APPLICATIONS

The present application claims priority under 35 U.S.C. §119 to U.S. Provisional Application No. 60/748,089, filed Dec. 7, 2005, the entire contents of which are hereby incorporated by reference in their entirety.

BACKGROUND

1. Field

Integrated circuits and devices, and methods of producing and/or using such, are disclosed, such as MOS transistors and Junction Field Effect Transistors (JFETs) and circuits.

2. Background Information

Very Large Scale Integrated Circuits are being scaled to smaller dimensions to gain greater packing density and faster speed in a continuation of the trend of the past thirty years. Currently, CMOS technology is being manufactured with sub-100 nanometer (nm) minimum dimensions in 2005. Scaling CMOS with the minimum line width below 100 nm presents numerous problems to designers of integrated circuits. A few of the problems of the scaled CMOS transistors below 100 nm are highlighted below;

1. Power dissipation in CMOS is a big problem due to the high switching load caused by the increase in gate capacitance per unit area as the thickness of the gate dielectric is scaled.
2. The thickness of the gate dielectric used in the MOS transistor has been scaled down to less than 20 angstroms. Thinning of the gate dielectric has resulted in a significant amount of current through the gate dielectric as voltage is applied to the gate electrode. This current is termed the gate leakage.
3. The transistors conduct a finite current between the drain and source even when the gate voltage is reduced to zero. This current is termed the source drain leakage.
4. The result of the effects described above is CMOS circuits which conduct a significant amount of current even when there is no activity (static current); this undermines a key advantage of CMOS. Because of the static current, the static power, or the power dissipated by the CMOS chip when there is no activity, has become quite large, and at temperatures close to 100 degrees centigrade, the static power dissipation can become nearly equal to the dynamic power dissipation in CMOS circuits. As the CMOS technology is scaled to 65 nm, the problem of leakage is becoming more severe. This trend continues as the technology is scaled further to line widths of 45 nm and below.
5. The lateral scaling of CMOS design rules has not been accompanied by vertical scaling of feature sizes, resulting in three dimensional structures with extreme aspect ratios. For instance, the height of the polysilicon gate has decreased only 50% while the lateral dimension of the polysilicon gate has been reduced by over 90%. Dimensions of the "spacer" (a component of a CMOS transistor which separates the gate from the heavily doped source and drain regions) are dependent upon the height of the polysilicon, so it does not scale in proportion to the lateral dimensions. Process steps which are becoming difficult with scaling of vertical dimensions include formation of shallow source and drain regions, their silicidation without causing junction leakage, and etching and filling of contact holes to the source and drain regions
6. It is well known to those skilled in the art to measure power supply leakage current as an effective screen for detecting defects introduced in the fabrication of the device. This method is sometimes referred to as the $I_{ddq}$ test by those skilled in the art. This method is effective for CMOS with the minimum line width above 350 nm. Scaling CMOS with the minimum line width below 350 nm increases the inherent leakage current to levels comparable to defect induced leakage current, rendering the $I_{ddq}$ test ineffective. Biasing the well voltage of the MOS device to eliminate the inherent leakage current introduces new elements of leakage such as gate leakage, junction tunneling leakage, etc.

The prior art in junction field effect transistors dates back to the 1950s when they were first reported. Since then, they have been covered in numerous texts such as "Physics of Semiconductor Devices" by Simon Sze and "Physics and Technology of Semiconductor Devices" by Andy Grove. Junction field effect devices were reported in both elemental and compound semiconductors. Numerous circuits with junction field effect transistors have been reported, as follows;

such as:

Nanver and Goudena, "Design considerations for Integrated High-Frequency p-Channel JFET's ", IEEE Transactions Electron Devices, vol. 35, No. 11, 1988, pp. 1924-1933.

O. Ozawa, "Electrical Properties of a Triode Like Silicon Vertical Channel JFET", IEEE Transactions Electron Devices vol. ED-27, No. 11, 1980, pp. 2115-2123.

H. Takanagi and G. Kano, "Complementary JFET Negative-Resistance Devices", IEEE Journal of Solid State Circuits, vol. SC-10, No. 6, December 1975, pp. 509-515.

A. Hamade and J. Albarran, "A JFET/Bipolar Eight-Channel Analog Multiplexer". IEEE Journal of Solid State Circuits, vol. SC-16, No. 6, December 1978.

K. Lehovec and R. Zuleeg, "Analysis of GaAs FET's for Integrated Logic", IEEE Transaction on Electron Devices, vol. ED-27, No. 6, June 1980.

In addition, a report published by R. Zuleeg titled "Complementary GaAs Logic" dated 4 Aug. 1985 is cited as prior art. The authors have also published the material in Electron Device Letters in 1984 in a paper titled "Double Implanted GaAs Complementary JFET's".

A representative structure of a conventional n-channel JFET is shown in FIG. 8. The JFET is formed in an n-type substrate 810. It is contained in a p-well region marked 815. The body of the JFET is shown as 820, which is an n-type diffused region containing source (832), channel (838), and drain (834) regions. The gate region (836) is p-type, formed by diffusion into the substrate. Contacts to the source, drain, and gate regions are marked as 841, 842, and 840, respectively. The critical dimension of the JFET is the gate length, marked as 855. It is determined by the minimum contact hole dimension 850, plus the necessary overlap required to ensure that the gate region encloses the gate contact. The gate length 855 is significantly larger than 850. This feature of construction of the prior art JFET limits the performance of these devices, since channel length is substantially larger than the minimum feature size. In addition, the capacitances of the vertical sidewalls of the gate diffusion to drain and source regions 861 and 862 respectively are also quite large. The gate—drain sidewall capacitance forms the Miller capacitance, a term known to those skilled in the art, and significantly limits the performance of the device at high frequencies.

SUMMARY

A method for using an inverter with a pair of complementary junction field effect transistors (CJFET) with a small linewidth is provided. The method includes having an input capacitance for said CJFET inverter to be less than the corresponding input capacitance of a CMOS inverter of similar linewidth. The CJFET operates at a power supply with a lesser value than the voltage drop across a forward-biased diode having a reduced switching power as compared to said CMOS inverter and having a propagation delay for said CJFET inverter that is at least comparable to the corresponding delay of said CMOS inverter.

BRIEF DESCRIPTION OF DRAWINGS

So that the manner in which the above recited features, advantages and objects are attained and can be understood in detail, a more particular description, briefly summarized above, may be had by reference to the embodiments thereof which are illustrated in the appended drawings.

It is to be noted, however, that the appended drawings illustrate only exemplary embodiments and are therefore not to be considered limiting as other equally effective embodiments will be apparent to those skilled in the art.

FIG. 3b is a diagram of the cross section of a poly gate JFET corresponding to FIG. 3a.

FIG. 21 shows the cross section of the silicon wafer after formation of isolation regions, well structures, threshold implants and gate dielectric. The gate dielectric is grown and etched from the wafer except for regions surrounding the MOS gate region.

FIG. 22 shows the cross section of the silicon wafer after polysilicon deposition, polysilicon doping and formation of a protective layer on top of the polysilicon.

FIG. 23 shows the cross section of the silicon wafer after polysilicon definition.

FIG. 24 shows the cross section of the silicon wafer after the link region is formed between the gate and the source/drain by ion implantation.

FIG. 37 shows an exemplary Figure of merit associated with CMOS, while

DETAILED DESCRIPTION

Figure 1:
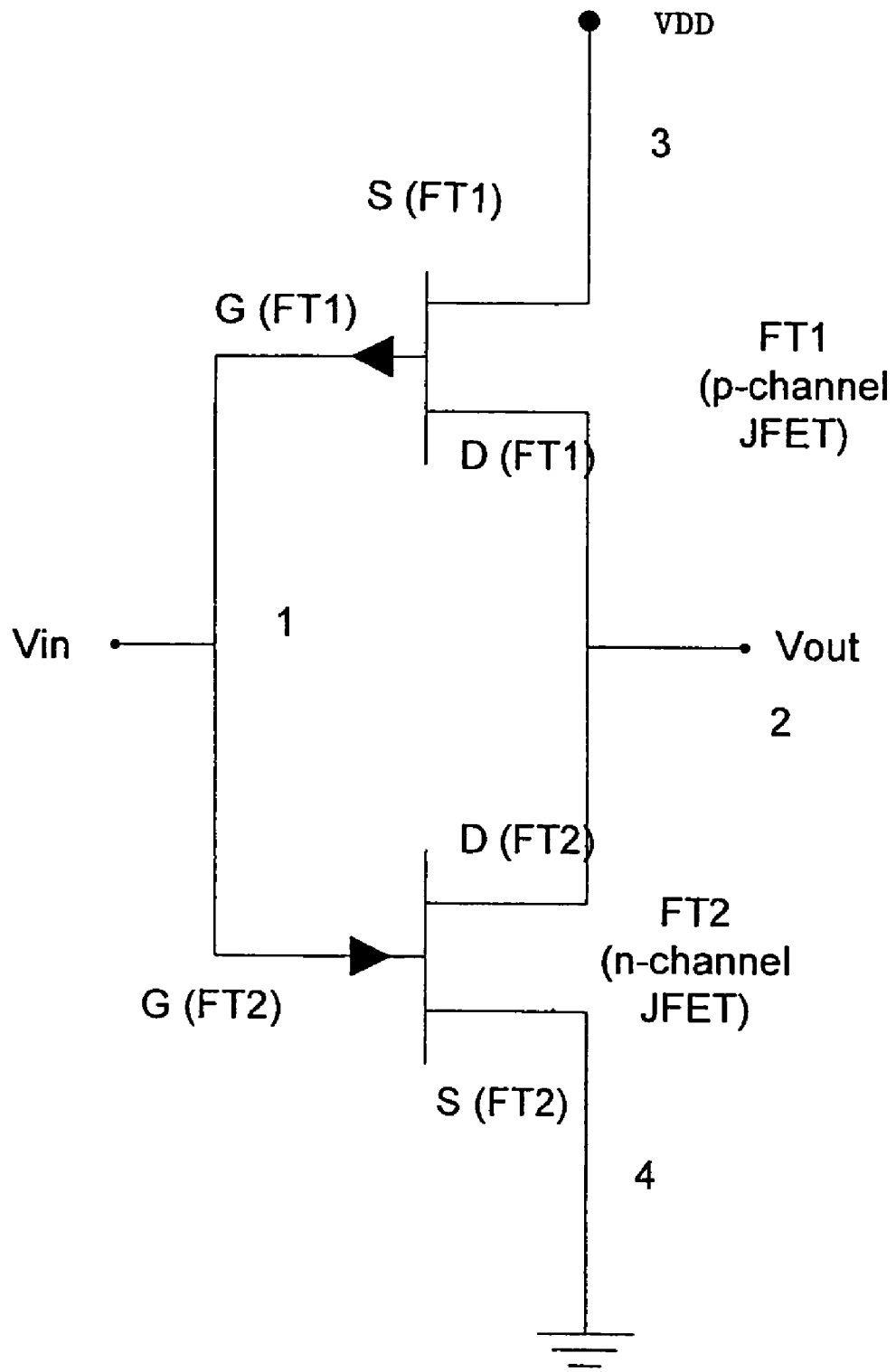
FIG. 1 is a diagram illustrating a complementary JFET inverter.

A method of building complementary logic circuits is disclosed using Junction Field Effect Transistors (JFETs) in silicon, an exemplary method is suited for deep submicron dimensions, such as below 65 nm.

A system of semiconductor devices having, for example, minimum feature sizes of 65 nm and below, is also disclosed. Methods and structures disclosed herein can build semiconductor devices and circuits which are similar to those used for CMOS devices. As such, exemplary embodiments can be inserted in an existing VLSI design and fabrication flow without any significant change in the overall system for designing and fabricating VLSI circuits. Exemplary attributes are as follows;

1. It allows significant reduction in the power dissipation of the circuit.
2. It allows significant reduction in the gate capacitance.
3. It allows significant reduction in the leakage current at the gate.
4. It allows significant reduction in the leakage current between source and drain.
5. It allows significant simplification of the VLSI manufacturing process.
6. It leverages the design infrastructure developed for CMOS technology. It is contemplated that all complex logic functions available in prior art CMOS cell library can be implemented with the devices disclosed herein. These complex logic functions include but not limited to inverter, n and, n or, latch, flip-flop, counter, multiplexer, encoder, decoder, multiplier, arithmetic logic unit, programmable cell, memory cell, micro-controller, JPEG decoder, and MPEG decoder.
7. It leverages the existing manufacturing and test infrastructure used for CMOS.
8. It allows the method of measuring power supply leakage current as an effective screen for detecting defects introduced in the fabrication of the device.

A complementary Junction Field Effect Transistor (JFET) disclosed herein is operated in the enhancement mode. As is known to those skilled in the art, enhancement mode, implies that the transistor is in the "OFF" state when the potential between the gate and the source terminals is zero. In this state, there is little or no current flow between drain and source when a positive (negative) bias is applied at the drain terminal of the n-channel (p-channel) JFET. As the potential at the gate is increased (decreased), the n-channel (p-channel) JFET enters the high conduction regime. In this mode, a finite current flows between the drain and the source upon application of positive (negative) bias at the drain. A limitation of known enhancement mode JFET devices is that their current drive is limited by the maximum gate voltage, which is less than one diode drop. A gate voltage in excess of one diode drop (the built-in potential) turns on the gate—channel diode which is an undesirable mode of operation for the JFET. This limitation can be resolved by, for example, limiting the biasing voltage, VDD, to less than one diode drop. The problem of low current drive of the JFET is addressed by scaling the channel length of the JFET to sub-100 nanometer dimensions. When the JFET gate length is less than 70 nanometers and the power supply voltage is 0.5 V, the current output of the complementary JFET devices and the switching speed of the inverters made with the complementary JFET devices compare favorably with known CMOS devices.

It should be noted that although the speed-power performance of the JFETs becomes comparable with the CMOS devices at sub-70 nanometer dimensions, the maximum power supply voltage for the JFETs can still be limited to below a diode drop. To satisfy certain applications which require an interface to an external circuit driven to higher voltage levels, structures and methods to build CMOS devices are also disclosed. The CMOS devices described herein differ from known CMOS along the following points;

1. CMOS is integrated with complementary JFETs.
2. In one embodiment, CMOS is built without any "spacer".
3. Contacts to the CMOS terminals can be planar, or at the same level, which can improve the manufacturability of the devices.
4. Other salient features of exemplary CMOS devices described herein.

An exemplary circuit diagram of an inverter is shown in FIG. 1. The operating terminal voltages of the two transistors under ON and OFF conditions are shown in Table 1:

TABLE 1

Terminal Voltages at the CFET Gate Under ON and OFF Conditions.

| Vin | Vout | FT1 | FT2 |
|---|---|---|---|
| 0 | Vdd | ON | OFF |
| Vdd | 0 | OFF | ON |

The operation of the circuit shown in FIG. 1 can be remarkably similar to the operation of the corresponding CMOS circuit. Exemplary embodiments of JFETs described herein can operate at voltage levels which are similar to the voltage levels of the known CMOS technology. The input voltage varies between 0 and Vdd. The output voltage varies between Vdd and 0 in an inverse relationship to the input voltage. Thus, for the two states of the inverter, when the applied voltage at the input terminal is 0 and Vdd, the output voltage is Vdd and zero respectively. This can be achieved by the two transistors FT1 and FT2 being switched ON and OFF, as stated in Table 1 above.

JFETs operate by applying a control signal at the gate, which controls the conduction characteristics of the channel between the source and the drain. The gate forms a p-n junction with the channel. The voltage at the gate with respect to the source controls the width of the depletion region of the gate-to-channel junction. The undepleted part of the channel is available for conduction. Thus, the channel is turned ON and OFF by applying appropriate voltages at the gate and source terminals of the JFET transistor. Current will flow between the source and the drain when the channel is turned ON and the appropriate voltage is applied to the drain.

The JFET transistors FT1 and FT2 in the JFET inverter can function in a manner very similar to the MOS transistors in a CMOS inverter. The operation of a CMOS inverter is well known to those skilled in the art. The p-channel JFET (FT1) is connected to the power supply at its source terminal. The n-channel JFET (FT2) is connected to the ground at its source terminal. The drain terminals of the two transistors are connected together and to the output terminal of the gate. The gate of the p-channel JFET FT1 and the gate of n-channel JFET FT2 are connected together and to the input terminal of the gate, as shown in FIG. 1. This circuit configuration is called a CFET inverter in the remainder of this document. In general, gates formed in a similar manner with p-channel and n-channel JFETs are called CFET gates.

The functioning of the inverter is explained in greater detail here in order to reveal an exemplary full implementation. This is accomplished by first explaining the voltages at the source and the drain terminals of the transistor, which are shown in Table 2. In an exemplary and non-limiting illustration, the power supply voltage is fixed at 0.5V.

TABLE 2

Junction voltages for JFETs in CFET Gate

| | | FT1 | | FT2 | |
|---|---|---|---|---|---|
| Vin | Vout | VGS | VDS | VGS | VDS |
| 0.5 | 0 | 0 V | −0.5 | 0.5 | 0 |
| 0 | 0.5 | −0.5 | 0 | 0 | 0.5 |

The gate of the p-channel JFET is made of n-type silicon and the channel is doped p-type. The doping profile of the p-channel JFET is designed to turn off conduction through the channel when the voltage on the gate terminal is at zero volts relative to the source terminal. This device is an enhancement mode device. This attribute of the p-channel JFET is due to the built-in potential at the p-n junction between the gate (p-type) and the channel (n-type). Since the source of the FT1 is tied to VDD at 0.5V, the external bias between the n-type channel and p-type gate is 0.0V when the gate of the FT1 is also at 0.5V. This represents the FT1 in the OFF condition. As the bias at the gate of the p-channel transistor is decreased to 0.0V, the negative voltage between the gate and the source terminals changes to −0.5V, which causes the depletion layer to collapse and allows the flow of current from source to drain. This represents the FT1 in the ON condition.

Exemplary embodiments can limit gate current when FT1 is in the ON condition. The channel-to-gate diode is forward biased at 0.5 V under this condition, so there is a finite leakage current which flows through the gate of the transistor. It is termed the gate leakage. The magnitude of the gate leakage is controlled by the built-in potential across the gate—channel junction. The built-in potential limits the gate leakage current to a very small amount when this CFET inverter is operated with supply voltages (VDD) at or below 0.5V for silicon-based circuits. Thus, the CFET inverter works in a manner similar to the CMOS inverter in both design and operating characteristics. The limit for supply voltages may be different for other materials because of differences in the built-in potential. Similarly, the bias voltages for the n-channel JFET are reversed; the transistor is turned "OFF" when the gate—source bias is reduced to zero and it is turned on when the gate—source bias is equal to the supply voltage VDD, which is limited to 0.5V in order to restrict the gate current. The gate current of a typical gate-channel junction is projected in the range of 1 uA/cm$^2$ to 100 mA/cm$^2$. In contrast, for an MOS transistor made with 45 nanometer lithography and appropriately scaled gate dielctric thickness, the gate current is projected to be in excess of 1000 A/cm$^2$.

The input capacitance of the JFET transistor is the junction capacitance of the diode formed by the gate—channel terminals. The capacitance of this diode is in the range of 10$^{-8}$ F/cm$^2$ to 10$^{-6}$ F/cm$^2$, determined by the thickness of the depletion layer width of the junction, which is in the range of 100 angstroms to 3000 angstroms. The input capacitance of an MOS transistor made with 45 nanometer design rules and 10 angstrom thick oxide is an order of magnitude higher than the corresponding input capacitance of the JFET. This feature makes the JFET extremely attractive from the perspective of low power operation.

Figure 2A:
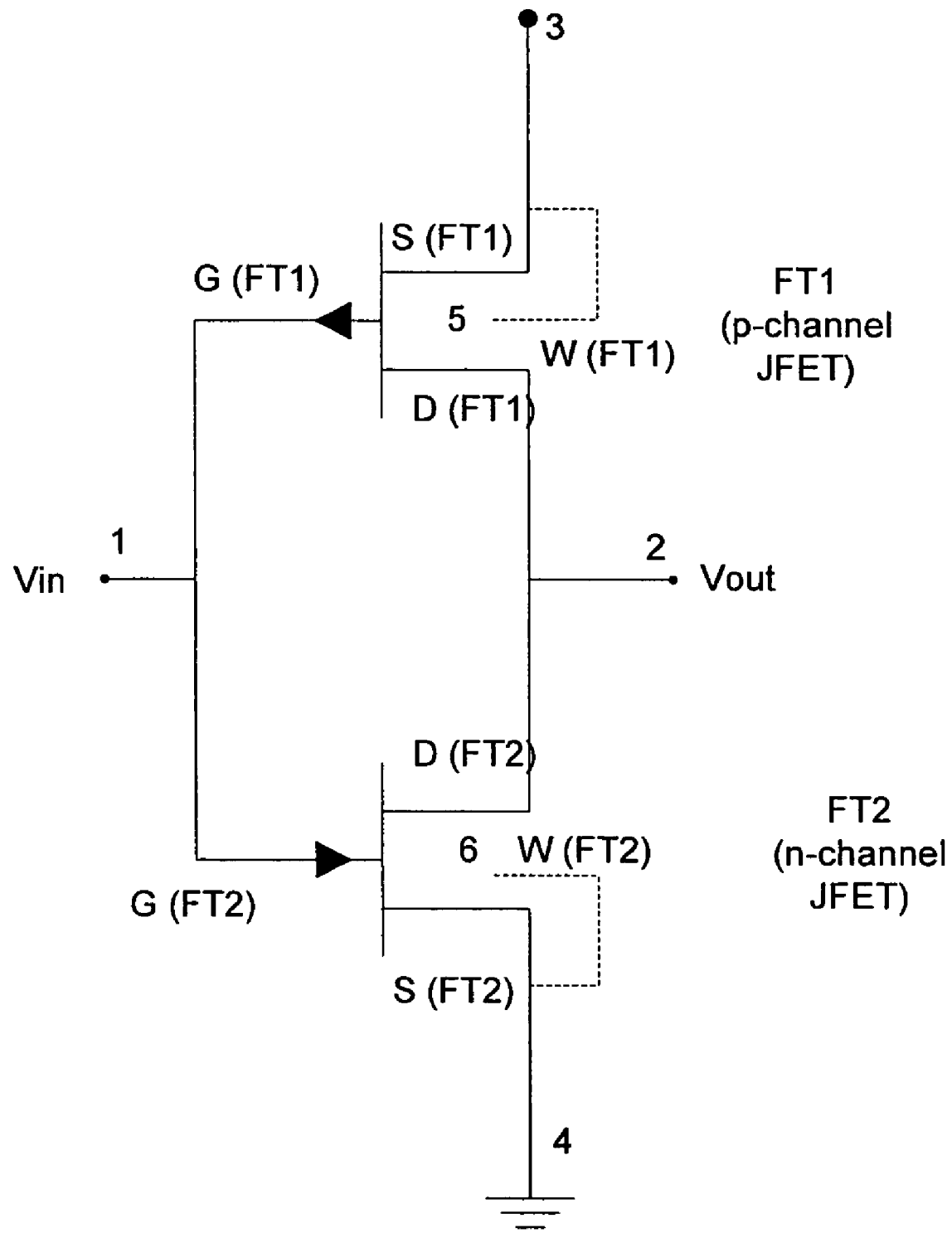
FIG. 2a is a diagram of a complementary JFET inverter with the well tied to the source.

The JFET transistors also have a fourth electrical terminal, namely the well. One embodiment of the invention is described here with the well connected to the source terminal for both the JFETs, as shown in FIG. 2a.

Figure 2B:
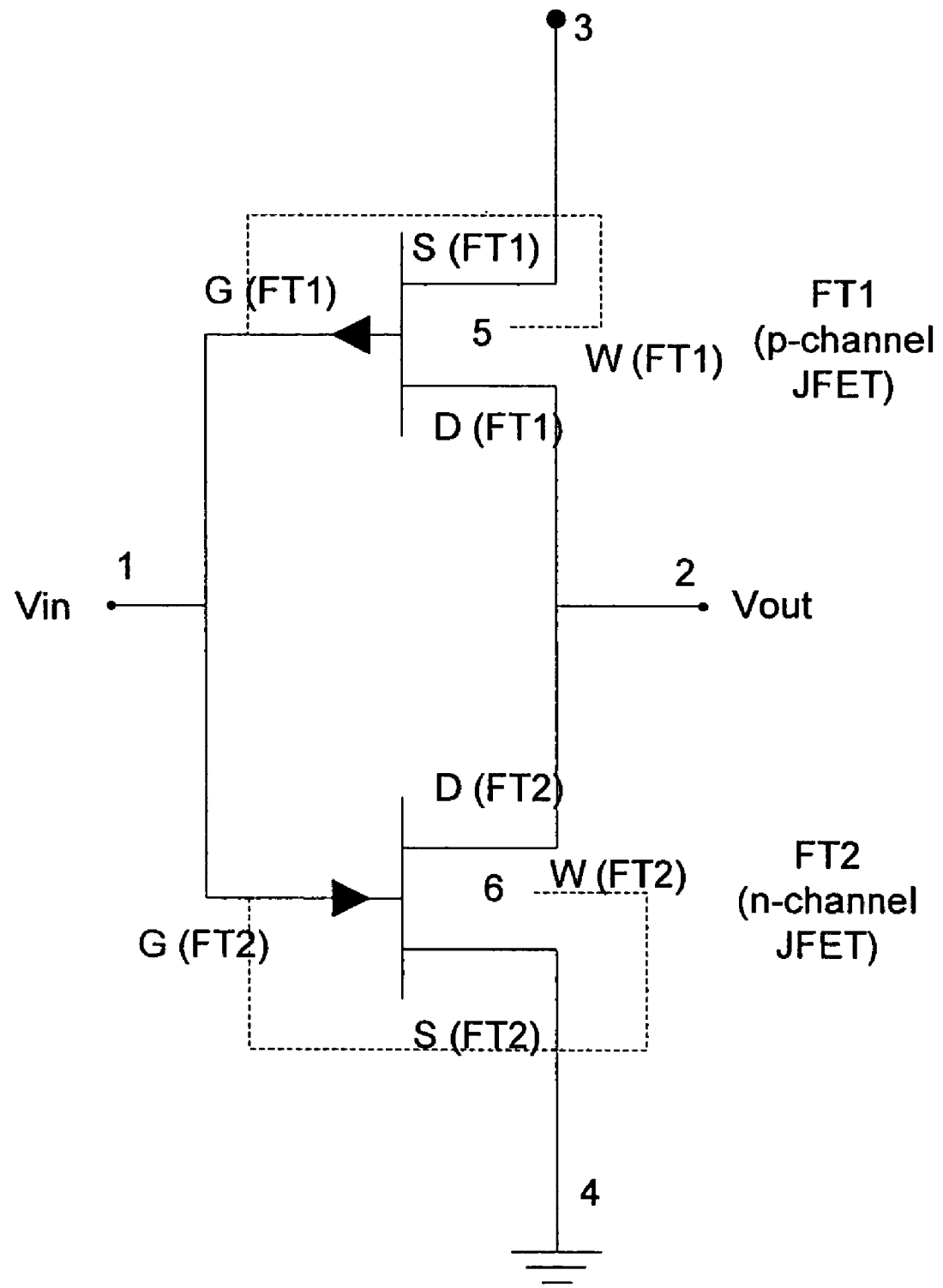
FIG. 2b is a diagram of a complementary JFET inverter with the well tied to the gate.

FIG. 2b shows an alternate embodiment, in which the well is tied to the gate and used for modulating the conductivity of the channel from both the top and the bottom.

Figure 2C:
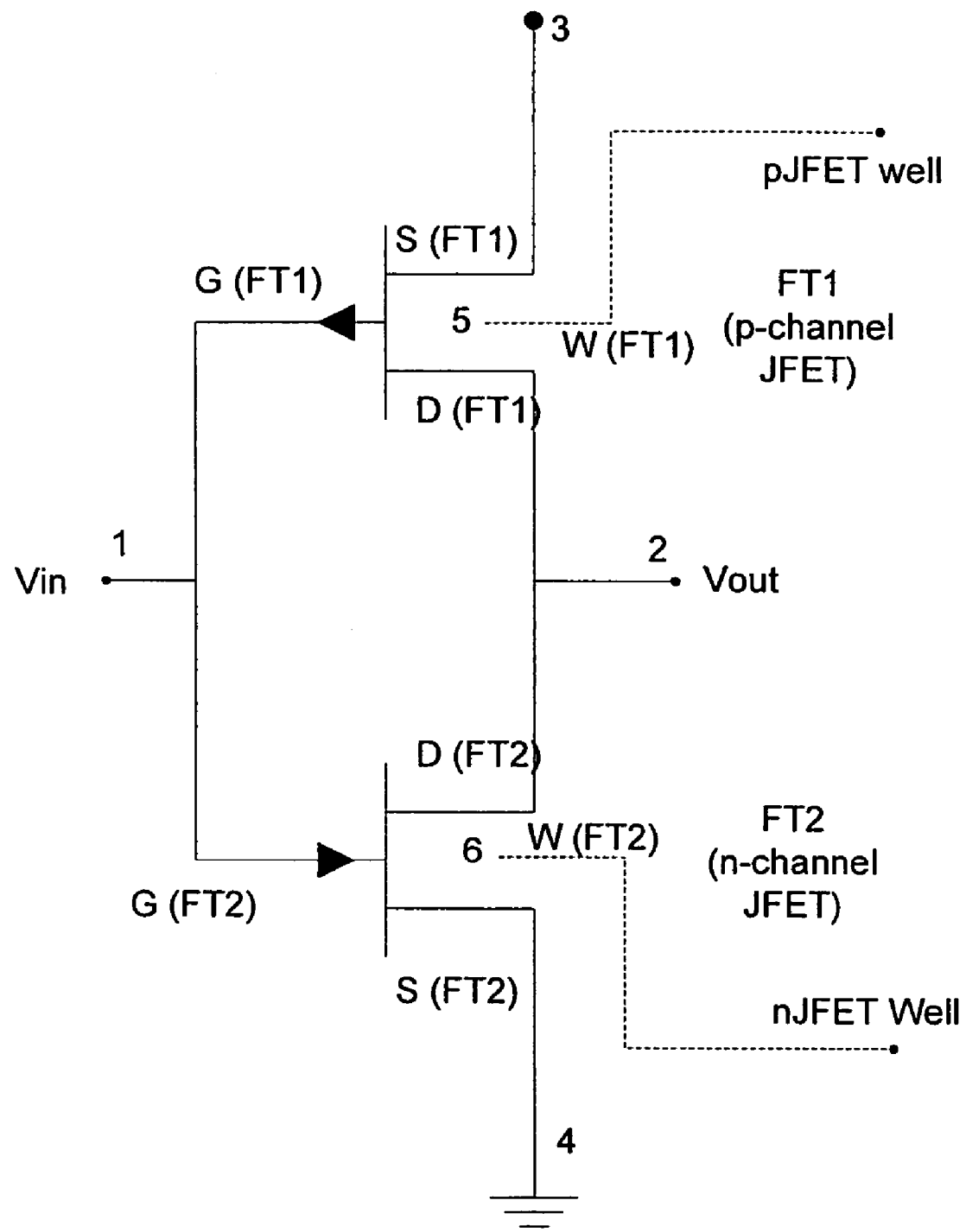
FIG. 2c is a diagram of a complementary JFET inverter with the well tied to an external pad.

FIG. 2c shows yet another embodiment, in which the well of the n-channel JFET is connected to an external terminal, which can be used for applying any signal to the JFET. In yet another embodiment, the well of the n-channel JFET is left floating. The corresponding description also applies to the p-channel JFET. It is well known to those skilled in the art to measure power supply leakage current as an effective screen for detecting defects introduced in the fabrication of the device. This method is sometimes referred to as the $I_{ddq}$ test by those skilled in the art. This method is effective for CMOS with the minimum line width above 350 nm. Scaling CMOS with the minimum line width below 350 nm increases the inherent leakage current to be comparable to the defect induced leakage current, thus rendering the $I_{ddq}$ test ineffective. For MOS devices with the minimum line width below 100 nm, biasing the well voltage of the MOS device to eliminate the inherent leakage current introduces new elements of leakage such as gate leakage, junction tunneling leakage, etc. In an exemplary embodiment, biasing the well voltage of the JFET can effectively reduce the inherent leakage current to the pico-ampere range. This makes the $I_{ddq}$ test an effective screen for detecting defects introduced in the fabrication of devices with the minimum line width below 100 nm.

Figure 3A:
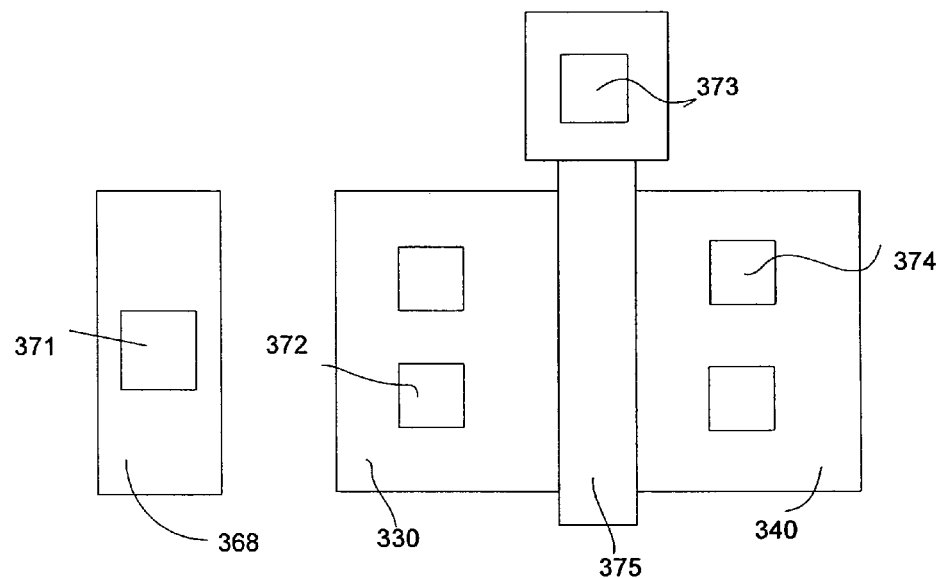
FIG. 3a is a diagram of the layout of a JFET.

FIG. 3a shows an exemplary and non-limiting layout of the JFET transistor which is used to build this circuit structure. The source, drain, gate and well tap of the n-channel JFET are given by 330, 340, 375, and 368 respectively. The contacts to these terminals are marked by 372, 374, 373, and 371 respectively.

Figure 3B:
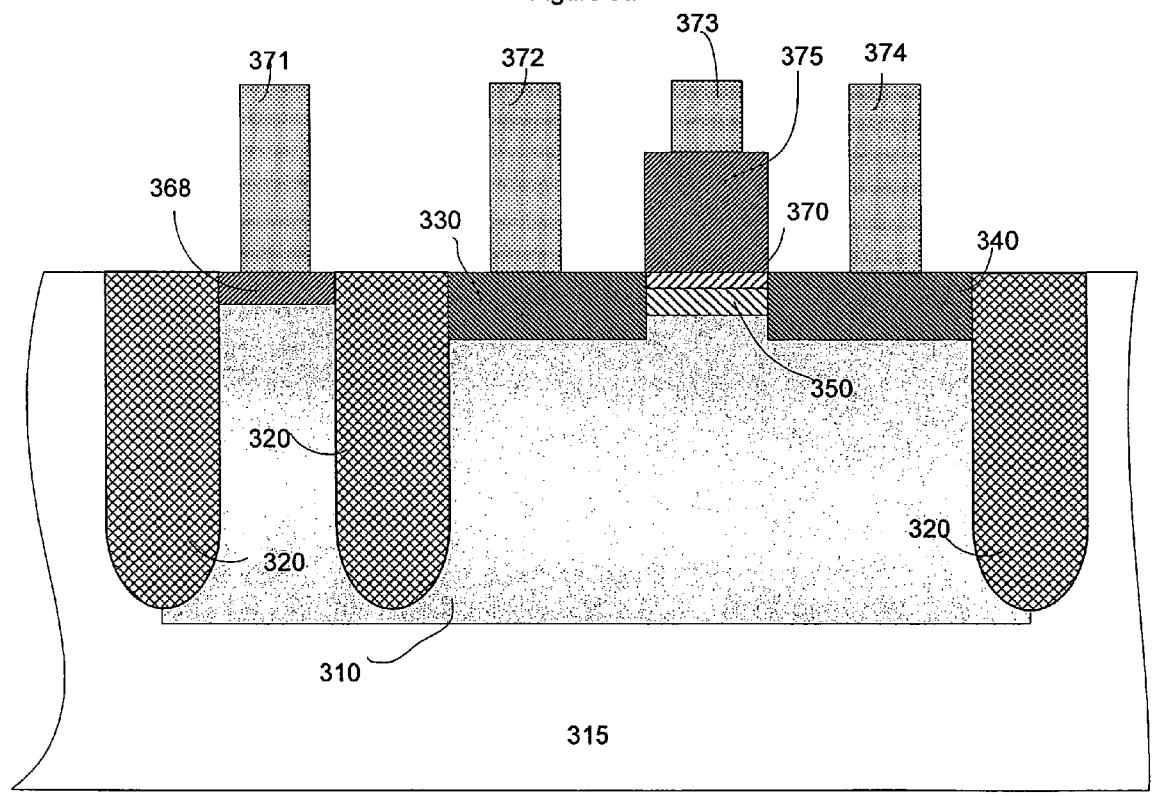

FIG. 3b shows a cross-section of the structure of an n-channel JFET which includes (e.g., consists on four terminals; source (330), gate (370), drain (340), and p-well (310). The JFET is formed in a region of silicon marked as 315. The JFET is isolated from the surrounding semiconductor by regions marked as 320; these are filled with an insulating material such as silicon dioxide. The channel between the source and drain is shown as object 350. For the n-channel JFET, the source and drain are highly doped n-type regions formed by doping silicon with donor type impurities such as phosphorous, arsenic or antimony. The well is doped by acceptor impurities such as boron or indium. The channel is a narrow region which is doped n-type connecting source and drain. The gate is a shallow p-type region 370 formed within the channel by methods such as diffusion of dopants from the heavily p+ doped polysilicon region 375.

Figure 3C:
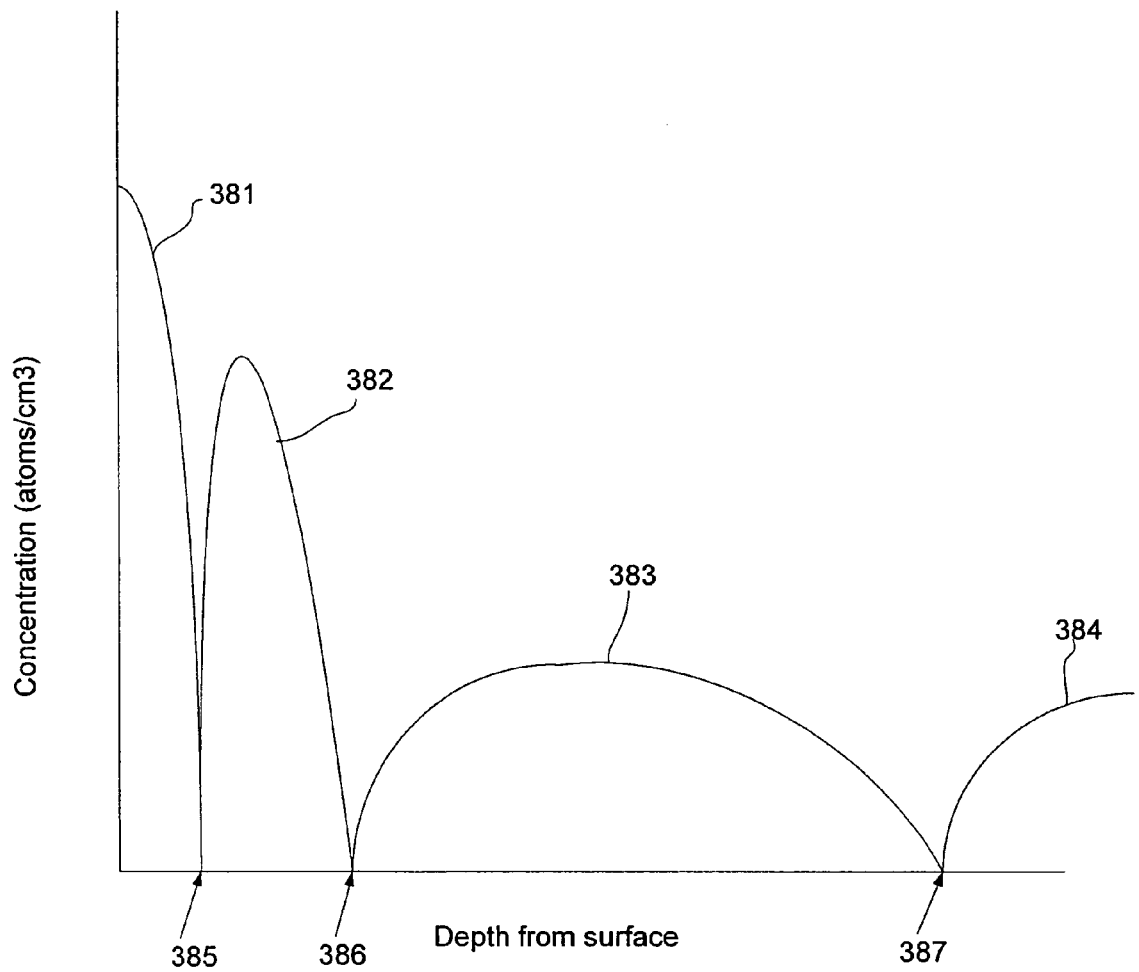
FIG. 3c is a graph showing the doping profile of a JFET through the gate and the channel.

A doping profile of the transistor at varying depths from the silicon surface through the gate (370) and channel (350) is shown in FIG. 3c. The 10 curve 381 is an exemplary doping profile of the gate region starting from the silicon surface. Curves 382, 383, and 384 represent the doping profile of the channel, well, and the bulk regions. For the n-JFET, 381 is the doping profile of the p-type gate region, 382 is the profile of the n-type channel region, 383 is the profile of the p-type well region, and 384 is the profile of the surrounding n-type bulk region. The gate—channel junction is given by 385, the channel—well junction is given by 386, and the well—bulk region junction is given by 387. The depth of the junction between gate and channel from the surface of silicon (385) is less than the depth of the junction between the channel and the p-well (386).

Other methods for forming the p-type gate junction, such as ion-implantation are encompassed herein. Other methods to dope the gate, such as plasma immersion implant, as is well known to those skilled in the art, are also encompassed.

In FIG. 3b, the Region 375 is a slab of polysilicon which is doped heavily p-type and acts as the source for doping of the gate 370. The p-type gate is used to control the conduction across the channel from source to drain. By this novel construction technique, the gate is diffused in the channel region from heavily doped polysilicon which also forms an ohmic contact with the gate. This allows the polysilicon to be used to connect the gate to the external circuit.

The ohmic contact to the well is made by the well tap marked as object 368. The contacts to the four terminals of the JFET, namely well, source, gate, and drain are shown in FIG. 3b also, as objects 371, 372, 373, and 374, respectively. The region underneath the p-well tap 368 is doped heavily with p-type impurities to make good ohmic contact. The p-well 310 is formed in an n-well marked as 315 for applications where the p-well of the JFET has to be isolated. For applications where the p-well is connected to the ground potential, the need for the n-well is obviated. Both of these cases are encompassed herein.

The doping types are reversed for the p-channel JFET in relation to those described in FIGS. 3b and 3c, i.e. the p-type regions are replaced by n-type regions and vice versa. It should be pointed out that doping the gate of the JFET with polycrystalline silicon 375 is maintained for the p-channel JFET also.

Figure 4:
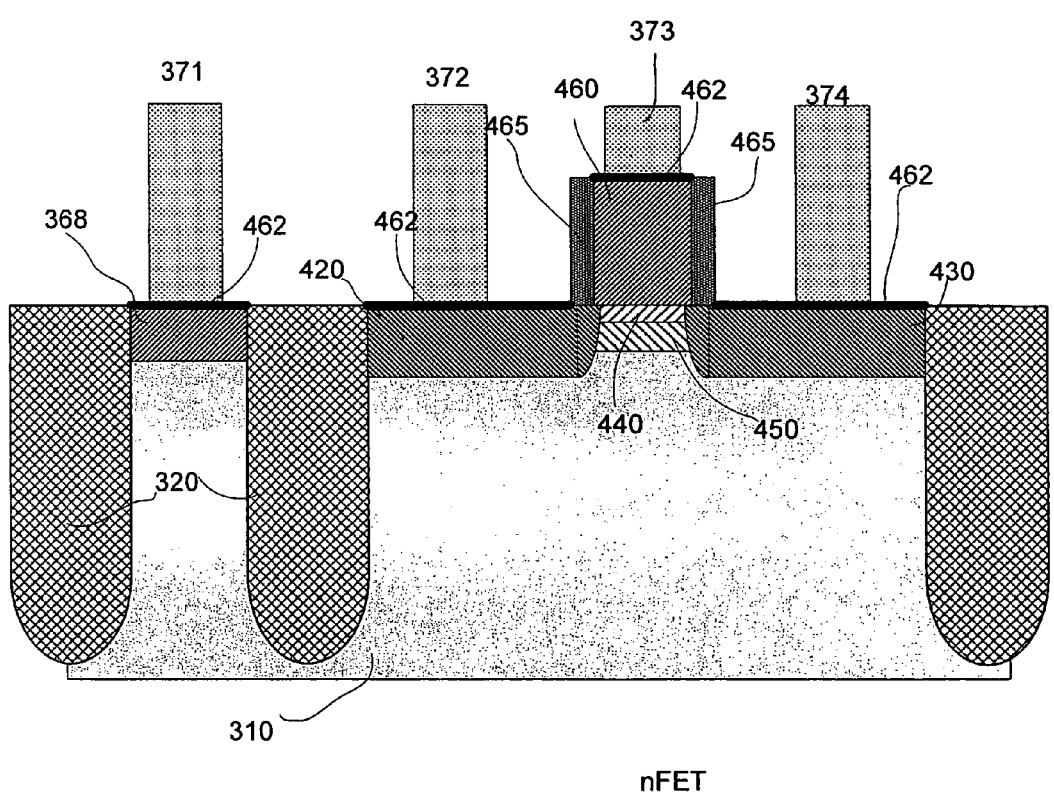
FIG. 4 is a cross section of a poly gate JFET similar to a conventional MOSFET.

An alternate embodiment of the JFET is shown in FIG. 4. This Figure shows the cross section of an n-channel JFET, which is very similar to an MOS transistor. The structure of the n-channel JFET is described here. It is implied that this structure will also be replicated for the p-channel JFET with appropriate changes in doping, as described in the paragraph above. The JFET is shown as object 400. The p-well in which the JFET is formed is marked as object 310. The isolation for the JFET is provided by a region filled with an insulating material such as silicon dioxide or other suitable materials in object 320. This structure is similar to the corresponding structure shown in FIG. 3. The heavily doped n-type regions form the source and drain region and are marked 420 and 430, respectively. The channel region between source and drain is lightly doped n-type and is marked 450. The gate region is doped p-type and is marked 440. This region is diffused from the polysilicon with heavy p-type doping marked as 460. An insulating region marked 465 is inserted here, surrounding the gate, consisting of a combination of silicon dioxide and nitride layers. This object is called a "spacer" in this document. In an exemplary embodiment, top surfaces of the regions 420, 430, 460 and 368 are covered with a highly conducting layer of one of the metallic compounds called silicides, marked as 462. The silicide layer is self aligned to the well tap, source, drain, and gate regions, implying that the silicide is formed only in the regions where there is exposed silicon or polysilicon. An exemplary purpose served by the spacer is that it isolates the source and drain regions from the gate region when self aligned silicides are formed. It also allows efficient distribution of current from the contact inside the device. The contacts to the well tap, source, drain, and gate regions are done in a manner similar to that in FIG. 3, and are marked as 371, 372, 373, and 374, respectively.

Figure 5:
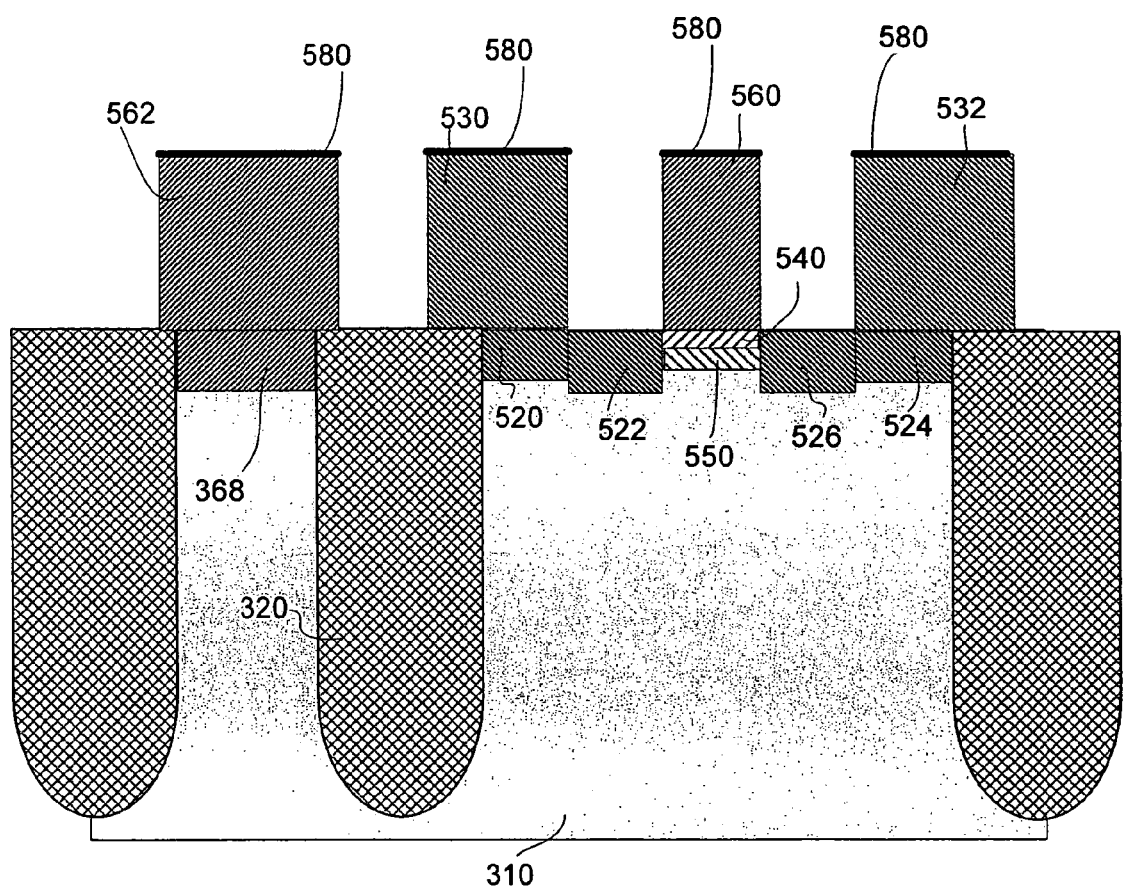
FIG. 5 is a cross section of a poly gate planar JFET with all the contacts made through polysilicon.

In an alternate embodiment of the JFET, as shown in FIG. 5, contacts to all the terminals of the JFET, namely source, gate, drain, and well, are all made with polysilicon. This structure has the desirable attribute of having contacts to all terminals at the same level. The n-channel JFET is made in a p-well marked 310, which is isolated from all sides by an insulated region 320. This structure is similar to the corresponding structure shown in FIG. 3. The source of the JFET is formed by a combination of heavily n-doped regions 520 and 522. The drain of the JFET is also formed by a combination of heavily doped n-type regions 524 and 526. The channel 550 is a shallow n-type doped region between drain and source. The p-type gate region diffused in silicon is marked as 540. Blocks 530 and 532 are heavily n-type polysilicon doped regions. The region 520 is formed by diffusing n-type impurities from the polysilicon into the silicon. Similarly, region 524 is formed by diffusion of n-type impurities from the polysilicon region 532 into the silicon. The gate region 540 is formed by diffusion of the p-type impurities from the p-type polysilicon 560 into the silicon. The regions 522 and 526 connect the source and the drain regions 520 and 524, respectively, to the channel 550. The polysilicon regions marked as 530, 532 and 560 are in ohmic contact with regions 520, 524, and 540 respectively. The regions 522 and 526 are formed by external doping such as ion implantation, plasma immersion implantation, or other similar doping methods. The well tap is formed by ohmic contact between the heavily p-doped polysilicon 562 and the p-type region 368. The contacts to the transistor are made at the top of the objects 530, 532 and 560 and 562. In order to reduce ohmic contact resistance of these regions, self aligned silicide is formed on top of the polysilicon layer, marked as 580. In an alternate embodiment, contacts to the terminals of the transistor are made directly to the polysilicon.

Figure 6:
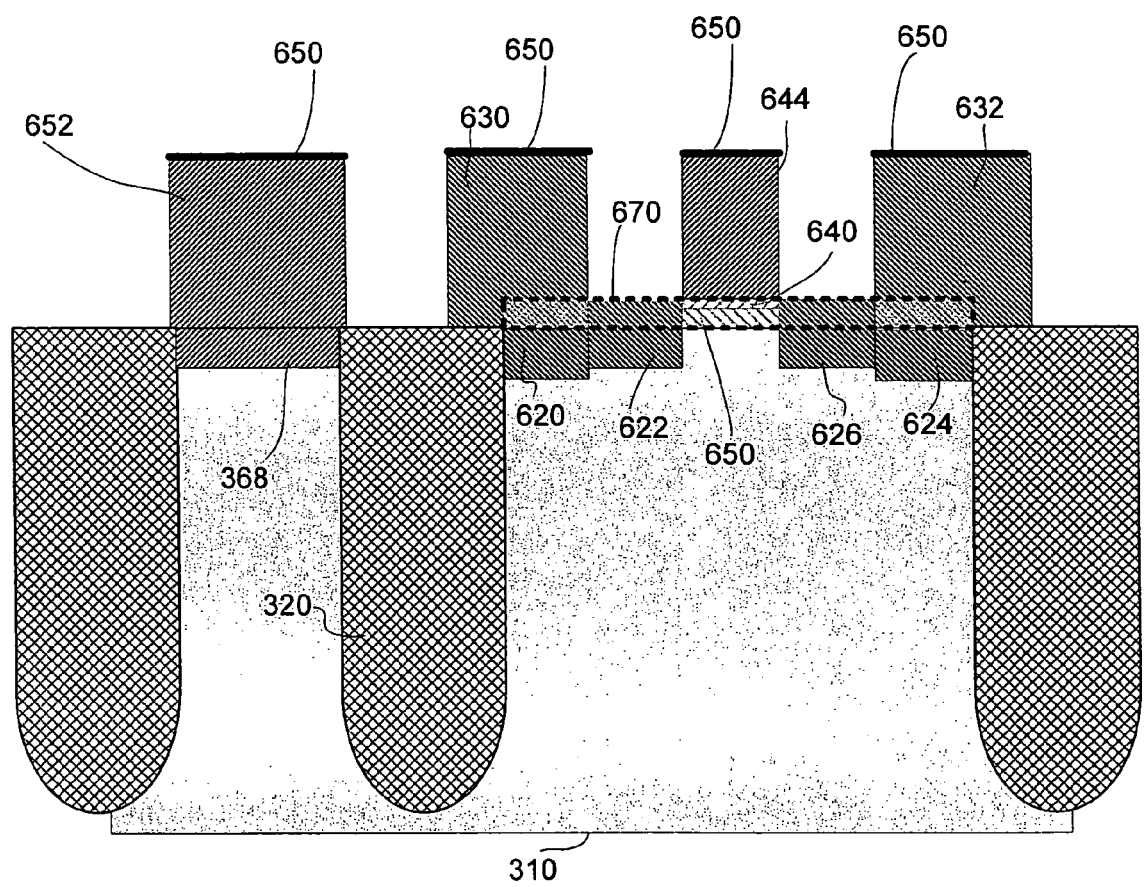
FIG. 6 is a cross section of a poly gate planar JFET with the channel region grown epitaxially.

In an alternate embodiment, the top surface of the silicon substrate is formed by epitaxial deposition of silicon-germanium alloy, which is doped appropriately to form the channel and the gate, shown in FIG. 6. The structure is built-in a well 310 with isolation regions 320. An exemplary feature of this embodiment is that the channel of the JFET is formed on an epitaxially deposited layer of silicon-germanium alloy marked as object 670. The mobility of the silicon-germanium alloy is much higher than silicon, which increases the performance of the JFET, especially at high frequencies. This epitaxial layer is deposited on the transistor after the formation of the isolation structure on the wafer. The epitaxial layer can be deposited selectively in this embodiment on the islands where the channel is to be formed. The epitaxial layer for the channel of the nJFET is deposited in one step, and the epitaxial layer for the channel of the PJFET is deposited in the next step. In another embodiment, the epitaxial layer is deposited on the wafer prior to the formation of the isolation structure. In yet another embodiment, the channel region is formed by a strained silicon-germanium alloy. Another embodiment teaches the use of silicon-germanium-carbon to build the channel region of the JFETs. The terms silicon-germanium alloy and strained alloys are well known to those skilled in the art. The silicon-germanium alloy is formed by deposition of a mixture of silicon and germanium atoms epitaxially on the silicon substrate. The remaining structure of the JFET is similar to the structure shown in FIG. 5. The doping of the epitaxially deposited channel is controlled by external doping, such as ion implantation. Alternately, the epitaxially deposited material is doped during deposition by methods such as atomic layer epitaxy and similar techniques. The epitaxial deposition steps are also applicable to the JFET structures shown in FIGS. 3 and 4.

Figure 7:
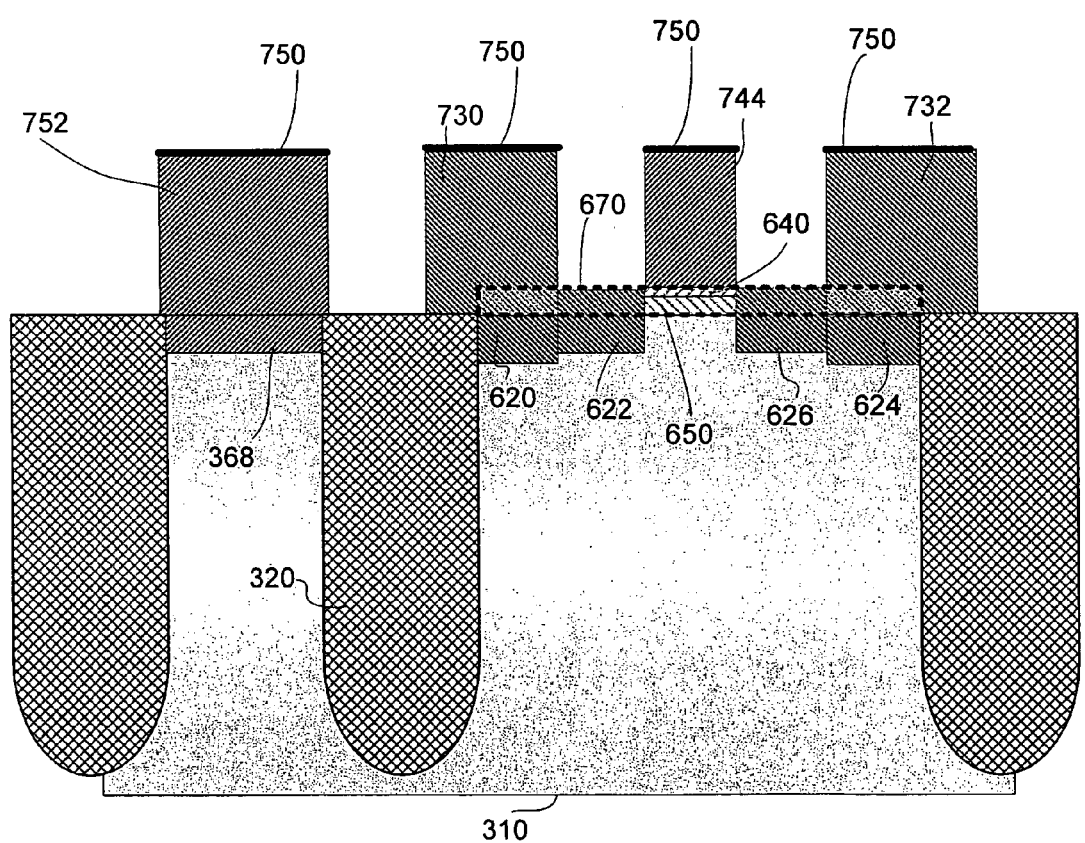
FIG. 7 is a cross section of a poly gate planar JFET with the channel region grown epitaxially and the polycrystalline semiconductor alloy gate comprising carbon, silicon, and germanium.
Figure 8:
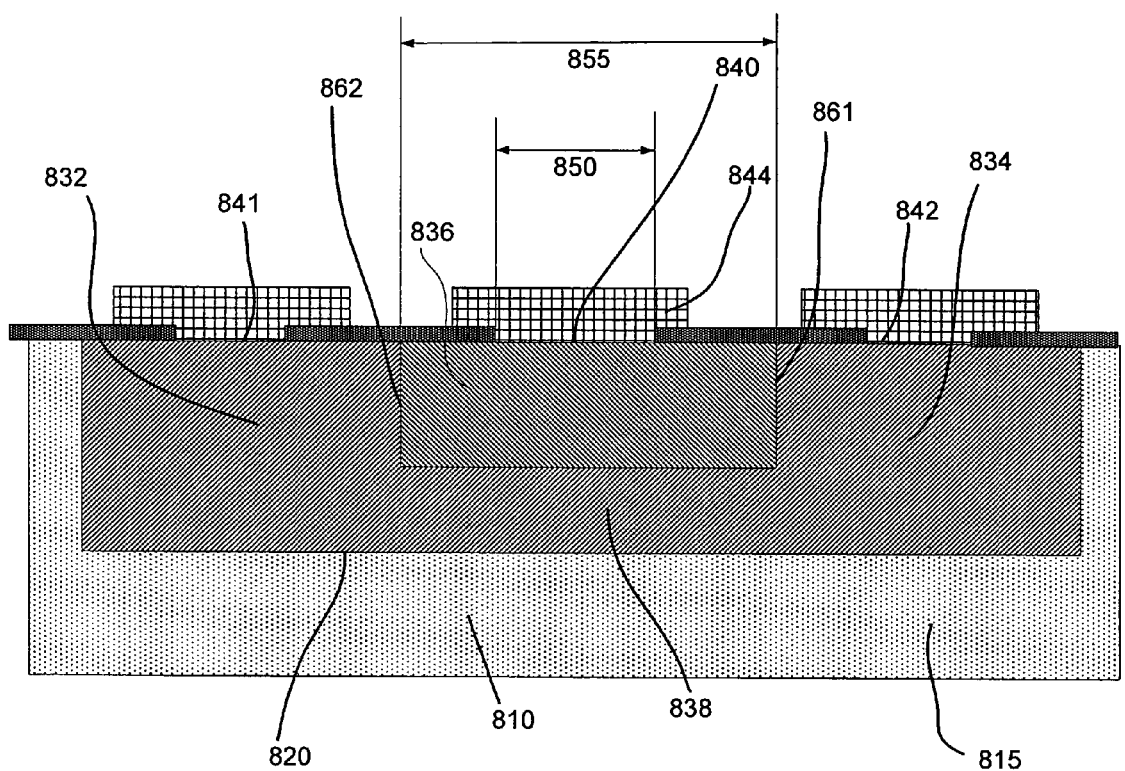
FIG. 8 is a cross section of a conventional n-channel JFET.

Another embodiment, shown in FIG. 7, involves the use of a high band gap material such as silicon carbide or silicon-germanium carbide to form the gate contact region 744. This feature is implemented in order to increase the barrier height at the p-n junction formed at the gate 640—channel 650 junction. The high band gap material of the gate contact region 744 in proximity to the gate region 640 effectively increases the barrier height at the p-n junction formed at the gate 640—channel 650 junction. The higher gate—channel junction built-in potential reduces the saturation current across the junction, and allows an increase in the maximum voltage which can be applied to the gate-channel diode to forward bias it without causing a significant amount of gate current to flow across the diode. Since the maximum voltage at the gate is equal to the power supply voltage of the inverter, a higher power supply voltage becomes possible, increasing the drive strength of the transistors and resulting in faster switching of the inverter. As shown in FIG. 7 for this embodiment, the polycrystalline silicon carbide material is used in place of polysilicon to form the electrodes. The use of a high band gap material such as polycrystalline silicon carbide reduces the leakage current of the gate junction when the gate-channel diode is weakly forward biased during the ON state of the transistor. Various phases of silicon carbide can be used for this purpose, namely 3C, 4H, and 6H. Further, various other electrode materials can be used to form a rectifying junction with the silicon substrate, including ternary alloys of silicon—germanium—carbon and various other compound semiconductors such as gallium—aluminum—arsenide—phosphide. In an alternate embodiment, use of materials for the gate such as silicon carbide is made along with epitaxially deposited high mobility materials such as silicon-germanium at the same time. The composition of the gate material is varied during deposition. The electrode extensions for source, drain, gate, and well tap, marked as 730, 732, 744, and 752, are made of high band gap semiconductor material such as silicon carbide. A self aligned conducting layer is formed on the top of these electrodes and is marked as 750. The polycrystalline semiconducting materials are doped appropriately, as described in the previous paragraphs. The other components of the transistors remain similar to the nJFET structure described in FIG. 6.

An exemplary embodiment teaches the use of a silicon-carbide layer near the surface of the silicon to a depth ranging from 10 Å to 1000 Å, followed by deposition of polysilicon to a depth of 10 Å to 2500 Å. The composition of the polycrystalline layer is varied to facilitate accurate monitoring of the etching process, in which the polycrystalline material is etched fast until the composition marking the bottom of the layer is detected and then slowly with a selective etching process until all the polycrystalline material is etched. Detailed explanation of the fabrication process using polycrystalline silicon carbide is explained later in this document.

Figure 9:
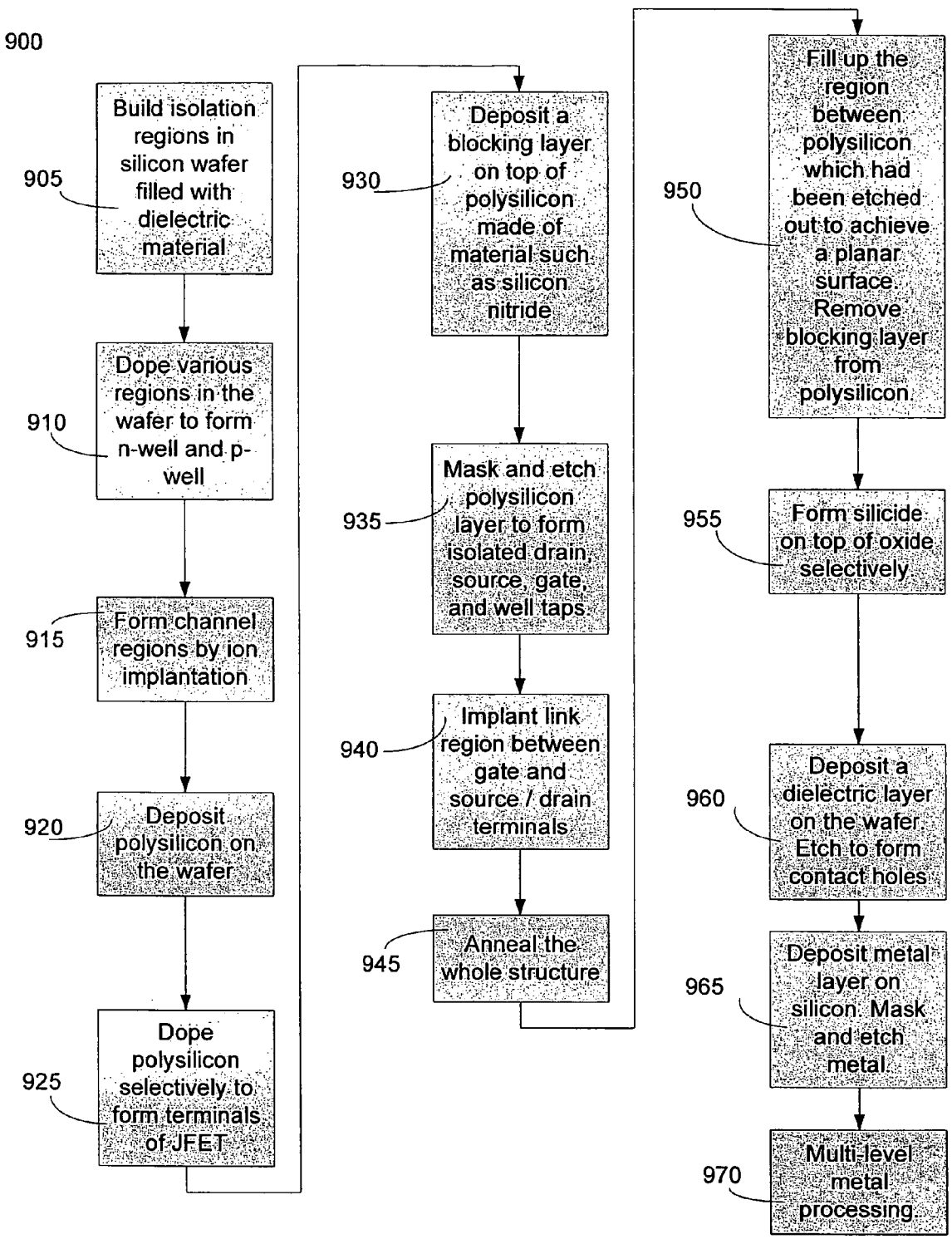
FIG. 9 is a flow chart of building the complementary JFET structure as shown in FIG. 5. Each step of the flow chart is further illustrated in FIG. 10-20.
Figure 10:
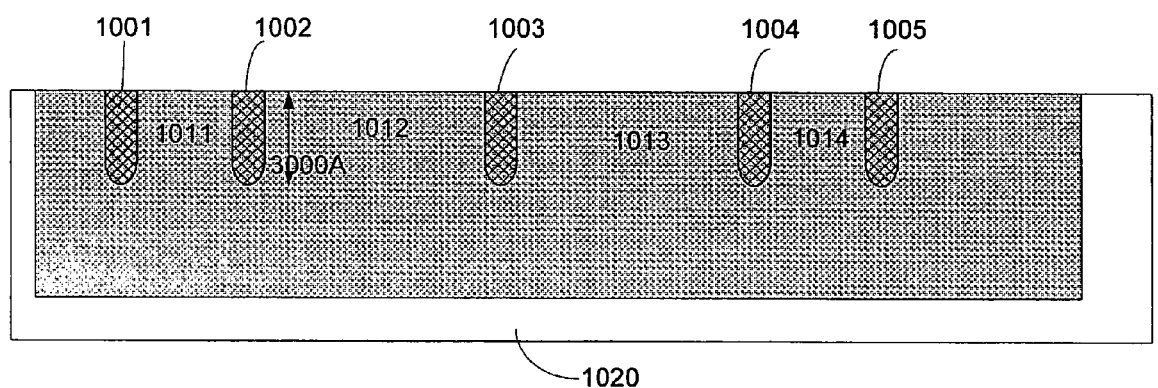
FIG. 10 is the cross section of the silicon wafer after the formation of the isolation region.
Figure 11:
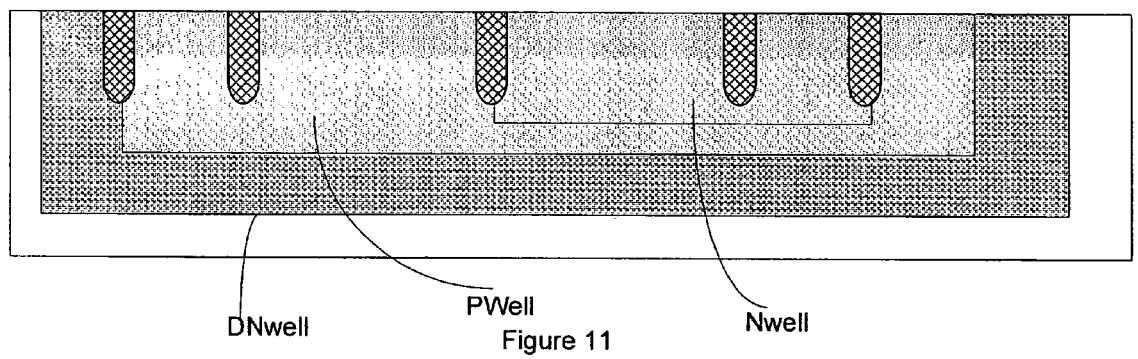
FIG. 11 is the cross section of the silicon wafer after the formation of the n-well and the p-well.
Figure 13:
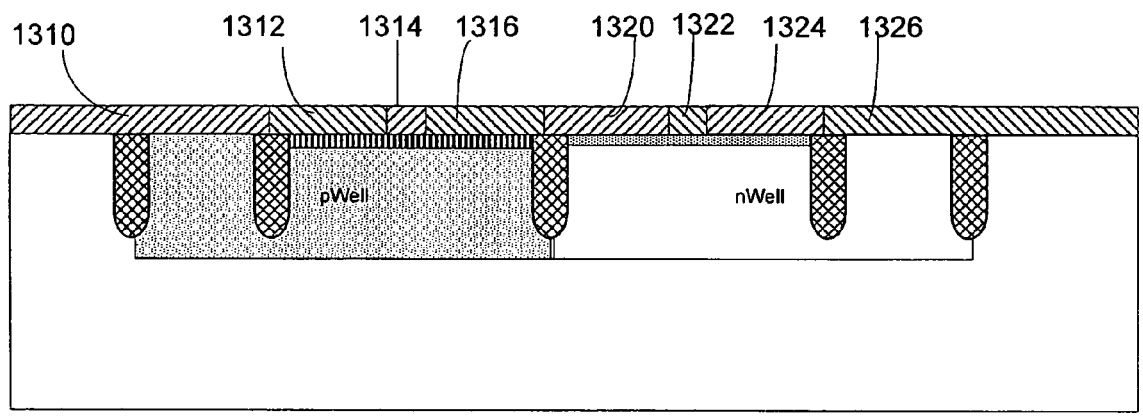
FIG. 13 is the cross section of the silicon wafer after polysilicon deposition and selective doping of polysilicon.
Figure 14:
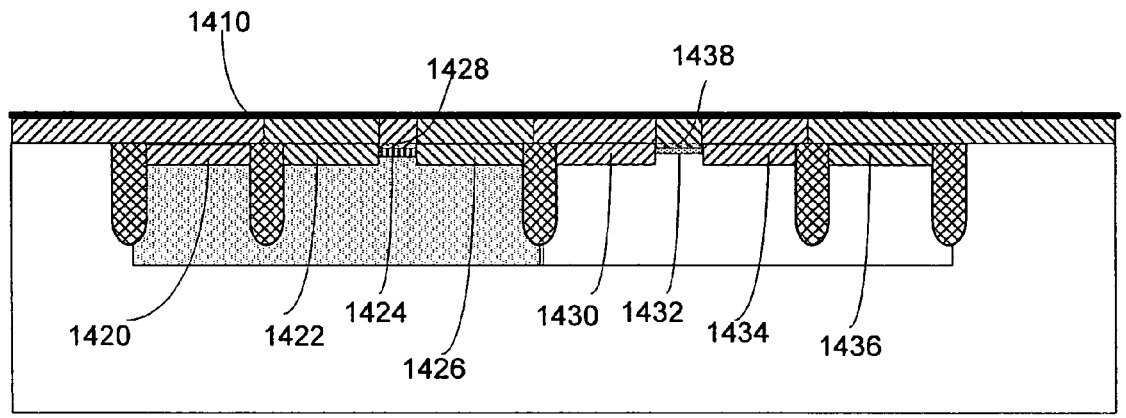
FIG. 14 is the cross section of the silicon wafer after deposition of a protective coating on the polysilicon layer.
Figure 15:
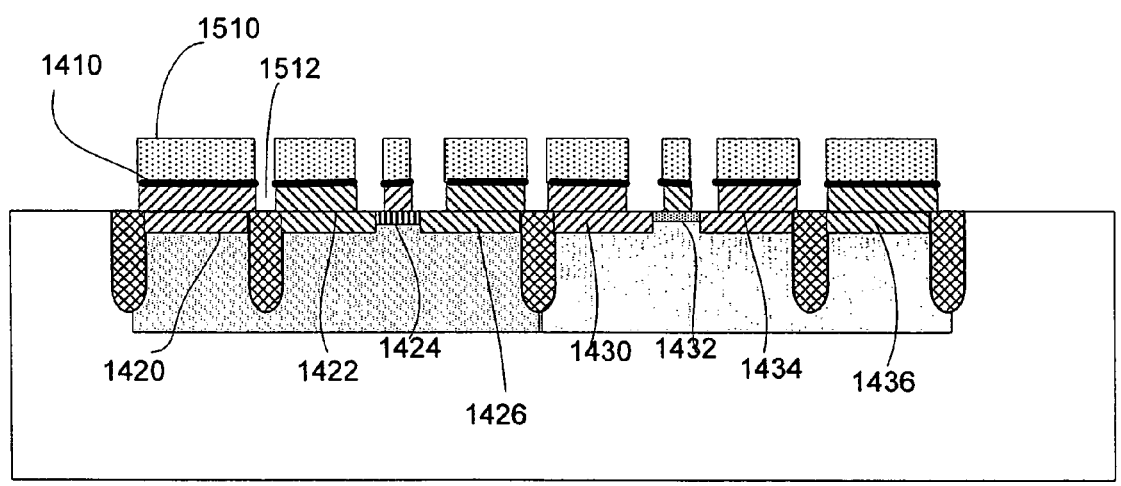
FIG. 15 is the cross section of the silicon wafer after polysilicon definition by photolithography and etching.
Figure 17:
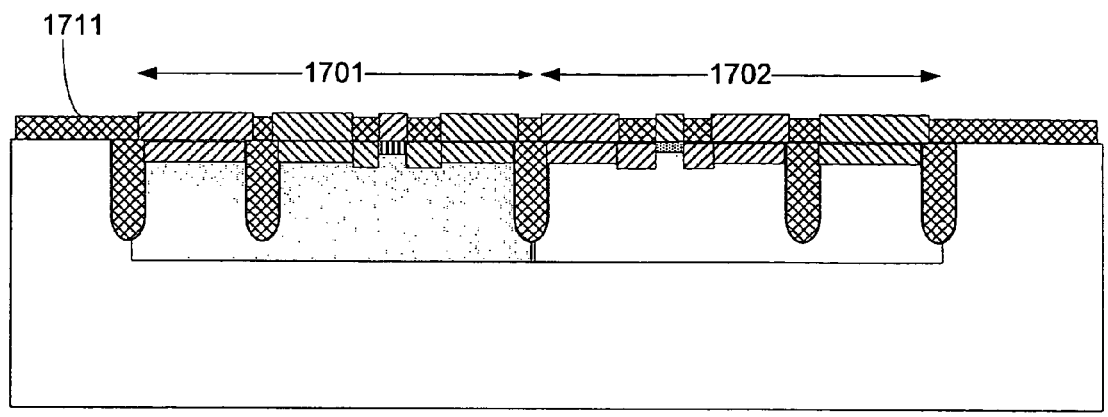
FIG. 17 is the cross section of the silicon wafer after filling the empty space between the polysilicon structures and then performing planarization.
Figure 18:
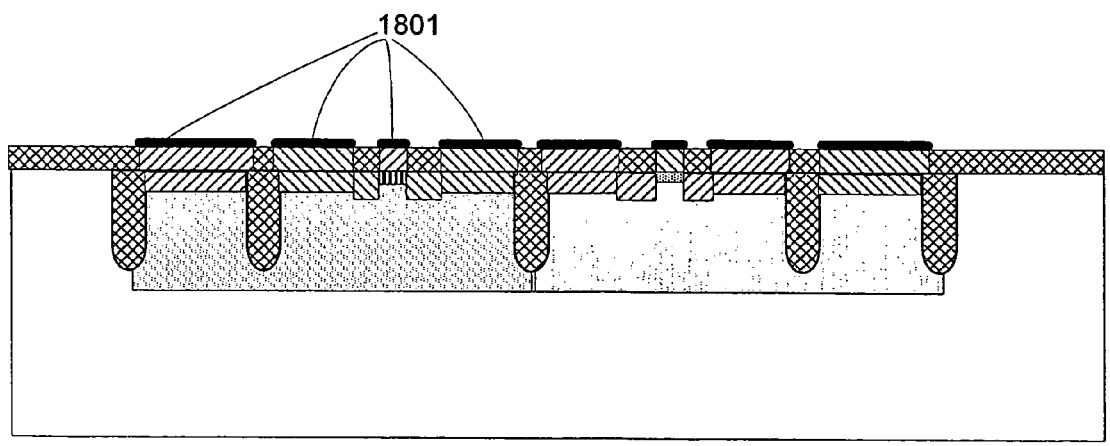
FIG. 18 is the cross section of the silicon wafer after formation of self aligned silicide on the exposed polysilicon surfaces.
Figure 19:
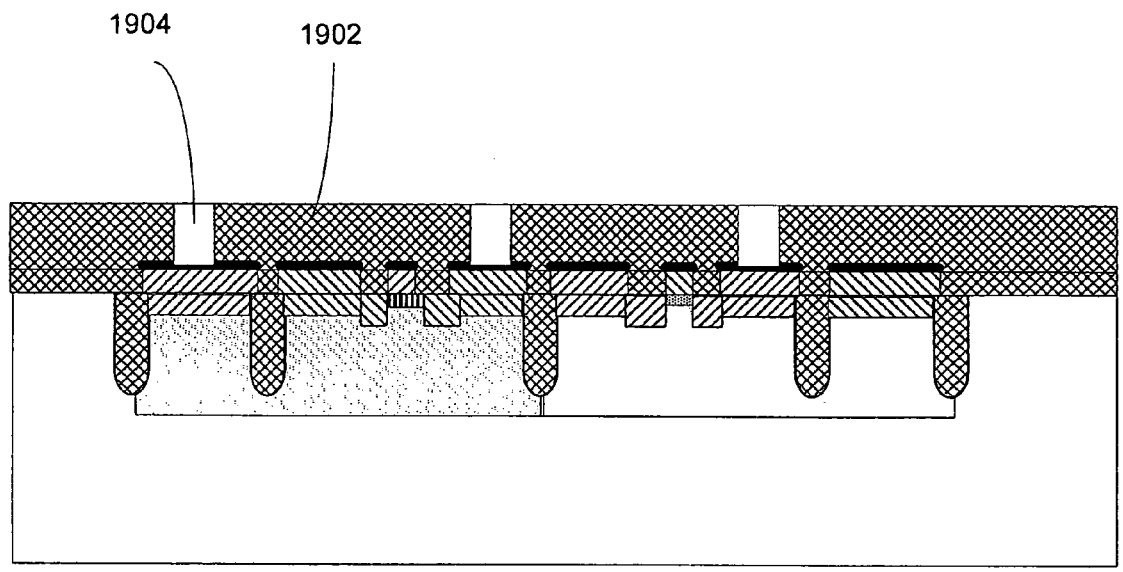
FIG. 19 is the cross section of the silicon wafer after deposition of the dielectric layer on polysilicon and the subsequent etching of contact holes.
Figure 20:
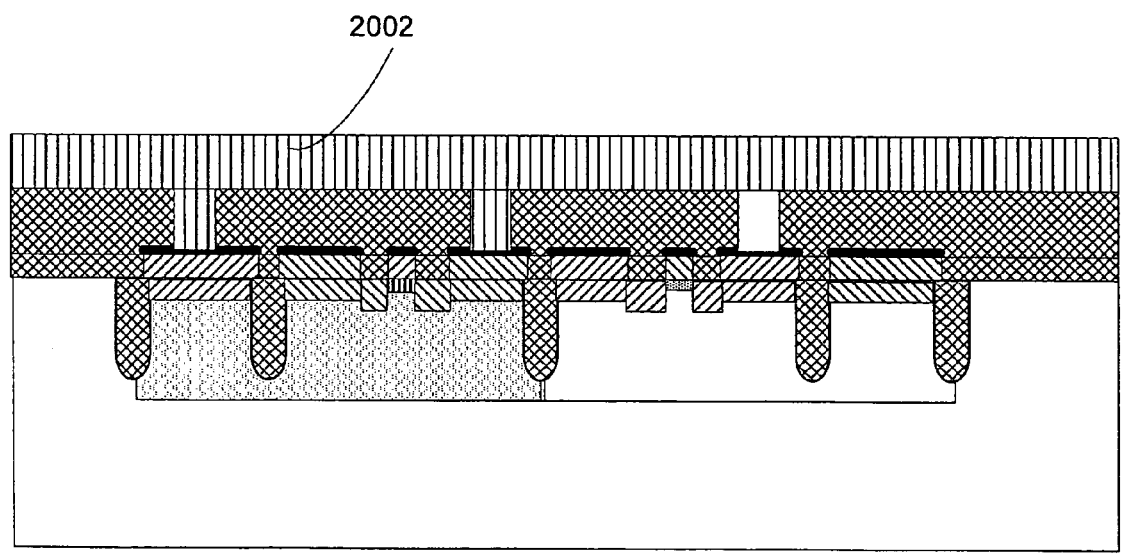
FIG. 20 is the cross section of the silicon wafer after metal deposition and definition.

Next, an exemplary but non-limiting method of building the complementary JFET structure as shown in FIG. 5 is illustrated as the flow chart in FIG. 9. Each step in the flow chart is further illustrated in FIGS. 10-20. Step 905 is illustrated in FIG. 10. Step 910 is illustrated in FIG. 11. Step 915 is illustrated in FIG. 12. Step 920 and 925 are illustrated in FIG. 13. Step 930 is illustrated in FIG. 14. Step 935 is illustrated in FIG. 15. Step 940 is illustrated in FIG. 16. Step 950 is illustrated in FIG. 17. Step 955 is illustrated in FIG. 18. Step 960 is illustrated in FIG. 19. Step 965 is illustrated in FIG. 20.

FIG. 10 shows the cross sectional view of a semiconductor substrate after the preliminary steps during the fabrication have been completed to achieve the isolation of the various regions where active devices will be formed by a combination of etching, thermal oxidation and deposition of silicon dioxide. Regions 1001-1005 represent the regions which are filled with insulating material comprises (e.g., consisting on silicon oxide and nitride by a combination of etching, deposition and thermal growth. The details of the process for the formation of these regions are well known to those skilled in the art and are beyond the scope of this disclosure. Regions 1011-1014 represent regions where active transistors are formed in the subsequent steps.

FIG. 11 shows the formation of n-wells and p-wells by doping the active regions with appropriate impurities in regions 1101 and 1102. For the n-wells in region 1102, phosphorous or arsenic atoms are implanted. The doping level of the implant varies between $1.0 \times 10^{11}/cm^2$ to $1.0 \times 10^{14}/cm^2$. The energy of implantation varies between 10 KeV and 400 KeV. For the p-wells in region 1101, boron is introduced by ion implantation with a dose varying between $1.0 \times 10^{11}/cm^2$ and $1.0 \times 10^{14}/cm^2$ and with the energy of implantation varying between 10 KeV and 400 KeV. Multiple implants may be used to achieve the desired impurity doping profile. In order to selectively implant regions with n-type and p-type impurities, implants are done using photoresist masks to shield the region not designed to receive the implant. Additional implants of boron are done under the isolation regions 1001-1005 to increase the doping in the region underneath the oxide and prevent any leakage between the two adjoining n-wells. The wafers are heat-treated to achieve the desired impurity doping profile.

Figure 12A:
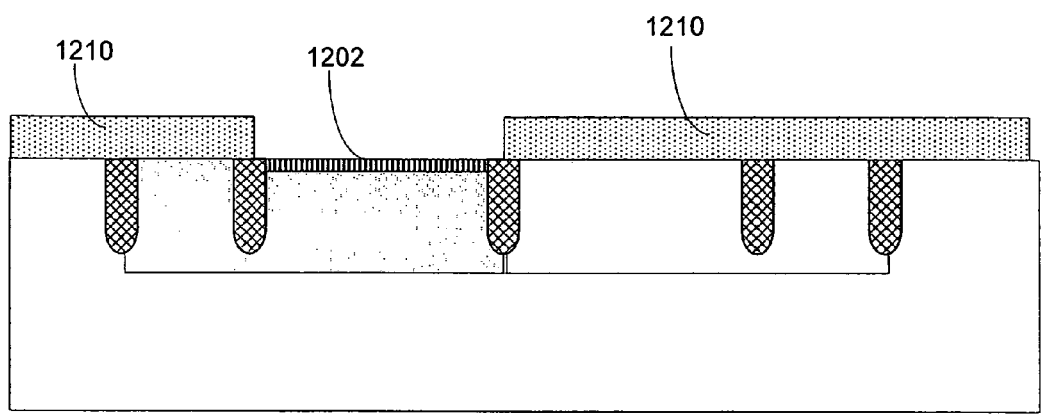
FIG. 12a is the cross section of the silicon wafer after the formation of the channel region of nJFET.
Figure 12B:
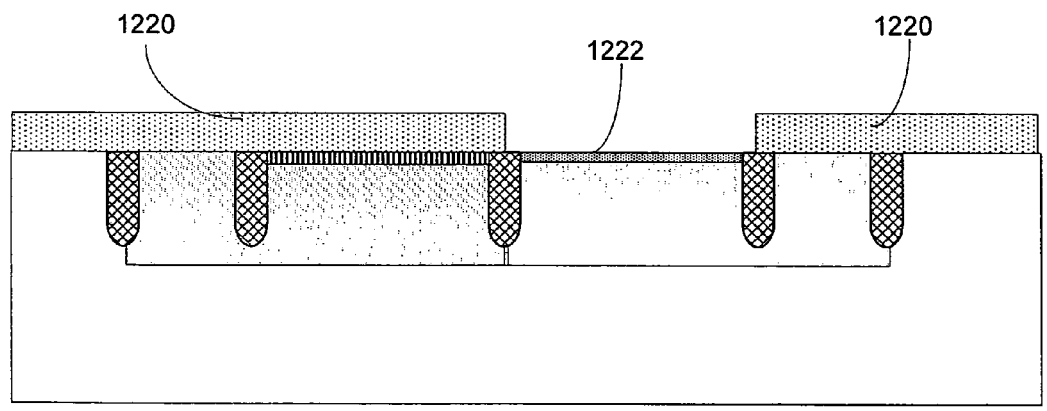
FIG. 12b is the cross section of the silicon wafer after the formation of the channel region of the pJFET.

FIGS. 12a and 12b show the formation of channel regions 1202 for the nJFET and 1222 for the pJFET respectively. The channel region is formed by selective implantation using photoresist masks. For the nJFET, the channel is formed by ion implantation with an n-type dopant such as arsenic, phosphorous, or antimony with an implant dose of $2.0 \times 10^{11}/cm^2$ to $1.0 \times 10^{14}/cm^2$ and with the implant energy between 1 and 100 KeV, shown as region 1202 in FIG. 12a. Also shown in the Figure is the photoresist 1210 covering the regions where the n-channel implant is to be blocked. Region 1222 in FIG. 12b is implanted with p-type impurities such as boron, indium or thallium to form the channel of the pJFET. In an alternate embodiment, the channel region is formed by plasma immersion doping. Alternately, the channel is formed by epitaxial growth of the channel region consisting of silicon, silicon—germanium binary alloys, or silicon—germanium—carbon tertiary alloys. Variations in formation of epitaxial regions by selective epitaxial growth of channel regions for n-channel and p-channel are encompassed herein, as well as a single deposition of the channel regions for both nJFET and pJFET, followed by selective doping. Yet another embodiment covers the instance in which the channel regions are doped during deposition by methods such as atomic layer epitaxy.

Next, a layer of polysilicon is deposited over the whole wafer, as shown in FIG. 13. The thickness of polysilicon deposited on the wafer varies between 100 Å and 10,000 Å. The polysilicon is selectively doped to form regions which will eventually become the source, drain, gate, and well contacts of the JFETs using photoresist as masks. The details of the photolithographic process are omitted here for the sake of brevity. As shown in 1300, the region marked as 1310 is doped with a heavy boron implant to a dose ranging between $1 \times 10^{13}/cm^2$ and $1 \times 10^{16}/cm^2$. It is designed to act as the contact for the well region of the n-JFET. Region 1314 is designed to act as the gate contact for the n-JFET. It is doped heavily p-type with the parameters similar to those of region 1310. Regions 1312 and 1316 are doped heavily with n-type dopants (phosphorous, arsenic, and antimony) to a dose ranging between $1 \times 10^{13}/cm^2$ and $1 \times 10^{6}/cm^2$.

The p-JFET is formed with regions 1324 and 1320 acting as the source and drain contacts (p type), respectively, region 1322 as the gate (n type), and region 1326 as the contact to the well tap (n type). Regions 1320 and 1324 are doped with a heavy concentration of boron atoms to a dose ranging between $1\times10^{13}/cm^2$ and $1\times10^{16}/cm^2$ and are designed to act as the source and drain contacts of the PJFET respectively. Similarly, regions 1322 and 1326 are doped heavily n-type and are designed to act as gate and well contacts of pJFET. In an alternate embodiment, a layer of oxide is deposited on top of the polysilicon layer before doing the ion implantation. The thickness of this layer varies between 20 Å and 500 Å. In another embodiment, layers of oxide and nitride are deposited on top of the polysilicon prior to ion implantation, with the thickness of the oxide and nitride films varying between 10 Å and 500 Å.

FIG. 14 shows the cross section of the silicon wafer with the polysilicon layer doped with impurities, and a protective layer 1410 on top of the polysilicon layer. The polysilicon layer with impurities implanted in various regions is used as a source of indirect diffusion of those impurities into the silicon to form the source, drain, and gate junctions and ohmic connections to the well. Regions 1422 and 1426 are the source and drain regions of the nJFET which are diffused from polysilicon regions 1312 and 1316. Region 1424 is the n-type channel. The gate region, marked as 1428, is diffused into the silicon from the p-doped polysilicon. Region 1420 is the p-type region (well tap) formed in the silicon by diffusion from the polysilicon region 1310 and forms an ohmic contact to the p-well which contains the nJFET. Similarly, the PJFET contacts in the silicon are formed by regions 1434 as the source, 1432 as the channel, region 1430 as the drain, region 1436 as the well contact, and region 1438 as the gate region of the PJFET. In an alternate embodiment, multiple ion implants, varying the implant dose and energy, of n-type and p-type dopants in polysilicon are made to form the well contacts, source, drain, and gate regions.

After diffusion of the various regions of the JFETs into the silicon, the gate patterning process takes place. Using an optical lithographic process, a layer of an anti-reflective coating, followed by a layer of photoresist are coated on the wafer. The thickness of these layers depends upon the selection of the photoresist, as is known to those skilled in the art. The photoresist layer is exposed and various terminals are delineated in the photoresist, marked as 1510 in FIG. 15. Alternate embodiment includes other methods of patterning the photoresist, including imprint lithography and e-beam lithography. With the photoresist layer as the mask, the protective layer above the polysilicon is etched first. Next, the polysilicon layer is etched, with the grooves such as 1512 reaching the bottom of the polysilicon layer. This step isolates the various terminals electrically, as shown in 1500. For patterning the photoresist, various processes such as optical lithography, immersion lithography, imprint lithography, direct write e-beam lithography, x-ray lithography, or extreme ultraviolet lithography are used.

Figure 16A:
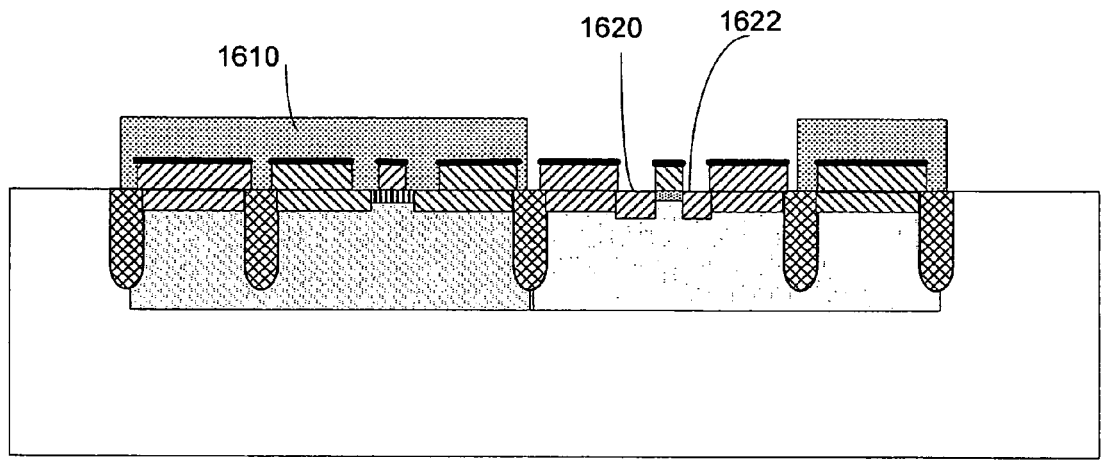
FIG. 16a is the cross section of the silicon wafer after doping the link region between the gate and the drain/source of the p-channel JFET.

FIG. 16a is the cross section of the silicon wafer after doping the link region between the gate and the drain/source of the p-channel JFET. After etching the polysilicon layer, the region between the heavily doped regions and the channel are doped to form a low conductivity path between the source and channel, and the drain and channel. They are called the link regions 1620 and 1622 (see FIG. 16a); as well as 1652 and 1654 (see FIG. 16b). FIG. 16a further shows the formation of the link region for a pJFET. The section of the wafer containing the nJFET is covered by photoresist 1610 during this step while a suitable doping process such as ion implantation or plasma immersion implantation is used to dope the link regions of PJFET 1620 and 1622. The link regions are formed to a junction depth independent from that of the neighboring source and drain regions, and are designed to provide a very low resistivity connection between source/drain and the channel.

Figure 16B:
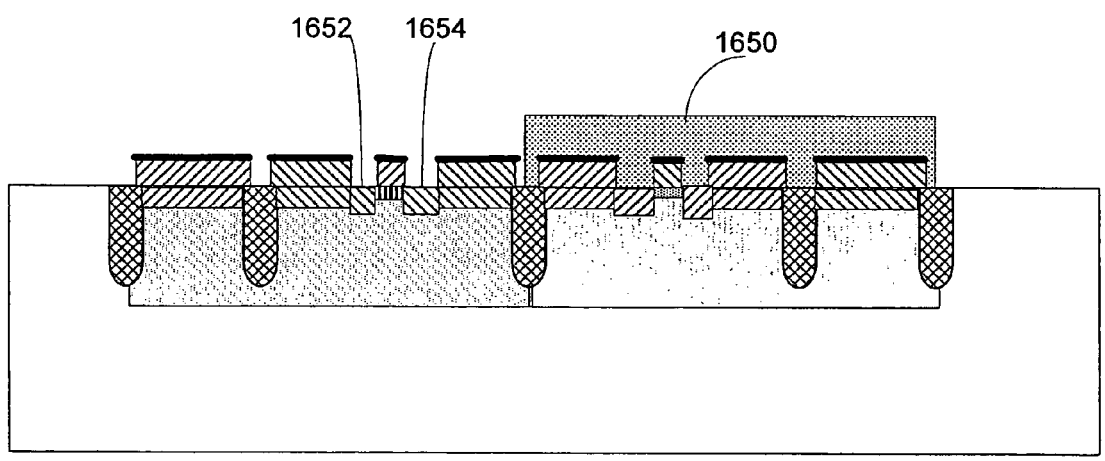
FIG. 16b is the cross section of the silicon wafer after doping the link region between the gate and the drain/source of the n-channel JFET.

FIG. 16b is the cross section of the silicon wafer after doping the link region between the gate and the drain/source of the n-channel JFET. Object 1650 is the photoresist covering the regions where the implant is blocked, which contain the PJFET. Regions 1652 and 1654 in the silicon are the link regions formed by the implantation of n-type dopants. After ion implantation, the dopants are activated by a rapid thermal annealing process. An oxidation step, at temperatures ranging between 700 C and 950 C and for times ranging between 10 seconds and 20 minutes, is also performed to oxidize the region of silicon damaged during etching.

FIG. 17 shows the cross section of the wafer after the gap between the polysilicon blocks is filled with an insulating material such as silicon dioxide and then processed, using a method such as chemical-mechanical-polishing, to provide a nearly planar surface at the same level as the polysilicon layer. The technique of filling insulating material in between the polysilicon blocks by depositing silicon dioxide using chemical vapor deposition or plasma assisted chemical vapor deposition is one which is widely used in semiconductor manufacturing. One such process employs the deposition of oxide by a low temperature plasma-activated reaction between silane and oxygen in gaseous form. The protective layer 1410 is finally removed to expose the bare polysilicon surface.

FIG. 18 is the cross section of the silicon wafer after formation of self aligned silicide on the exposed polysilicon surfaces. A layer of a metal such as nickel, cobalt, titanium, platinum, palladium, or other refractory metal is deposited on the polysilicon surface and annealed such that the exposed regions of polysilicon form a binary compound with the metal layer known as "metal silicides". The metal silicide is a very highly conductive substance. An exemplary thickness of the deposited metal is between 50 Å and 1000 Å on an atomically clean surface of polysilicon. The wafers are heated in a rapid anneal furnace at temperatures between 200 C and 800 C for a time period between 10 seconds and 30 minutes to form silicides selectively where metal is in contact with a silicon or polysilicon layer. After the reaction between the metal layer and silicon has taken place, the excess metal is removed from the wafer by a chemical etching process which does not affect the silicide layer. Unreacted metal is selectively etched off using appropriate solvents, leaving only metal silicide over the exposed silicon and polysilicon regions 1801. For titanium and cobalt, a mixture of hydrogen peroxide and ammonium hydroxide is used in ratio of 1:0.1 to 1:10 as appropriate at room temperature, although temperatures above room temperatures can also be used. Thus, a self aligned layer of silicide is formed on polysilicon. FIG. 18 shows the cross section of the device after formation of silicide on the polysilicon source, drain, gate, and well tap terminals. This polysilicon layer is also used as a local interconnect, whereby regions of silicided n-type polysilicon and p-type polysilicon are used for making ohmic contacts.

The next process step consists of depositing a dielectric (oxide) layer, etching contact holes in the oxide layer, and forming contact holes for the source, drain, gate and well tap terminals, and continuing with the conventional metal interconnect formation process as practiced in the formation of semiconductor chips. A cross section of the wafer after dielectric deposition and contact hole etch is shown in FIG. 19. The metal deposition and etch is shown in FIG. 20.

Figure 21:
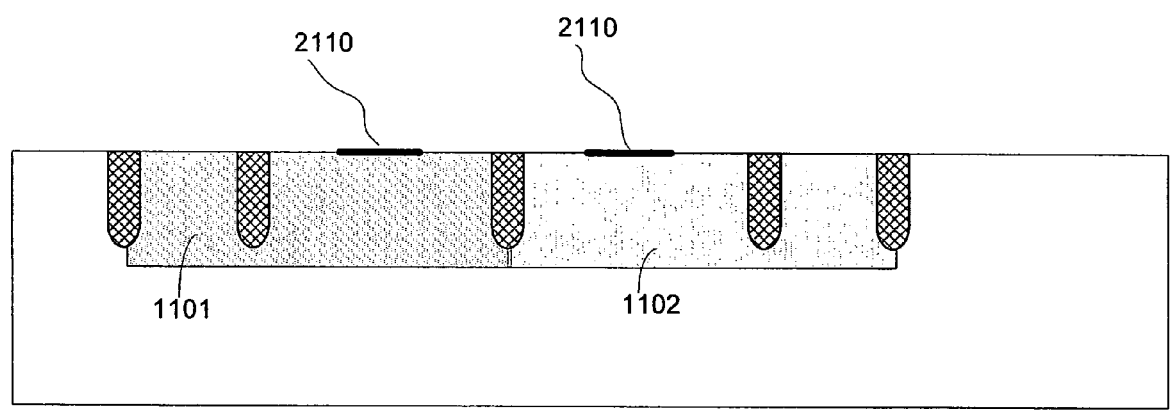
FIG. 21-24 describe the formation of a MOS transistor using the process adapted from FIG. 9.

This process can be adapted for making MOS transistors along with JFETs. One application of this adaptation is to include CMOS-compatible I/Os on the chip. The process to make MOS transistors is described next. FIG. 21 shows the cross section of a wafer after the formation of the n-wells and p-wells for JFETs and MOSFETs. The threshold ($V_t$) adjust implants for the MOSFETs are also completed. In addition, the formation of channel regions for the JFETs is also completed. A layer of gate dielectric (oxide or nitrogenated oxide) is grown on the wafer. This layer of oxide is etched away from the wafer except in the regions surrounding the gate of the MOSFETs. This oxide layer is shown as object 2110. In an alternate embodiment of this invention, a thin layer of amorphous silicon is deposited on top of the gate dielectric immediately after the oxide is grown. The thickness of this amorphous layer is sufficient to prevent damage to the underlying gate dielectric during the next photomasking and etching step. The preferred thickness of this amorphous silicon layer is between 10 Å and 5000 Å. In an alternate embodiment of the invention, the oxide layer is formed first, and the channel for the JFETs is formed afterwards.

Figure 22:
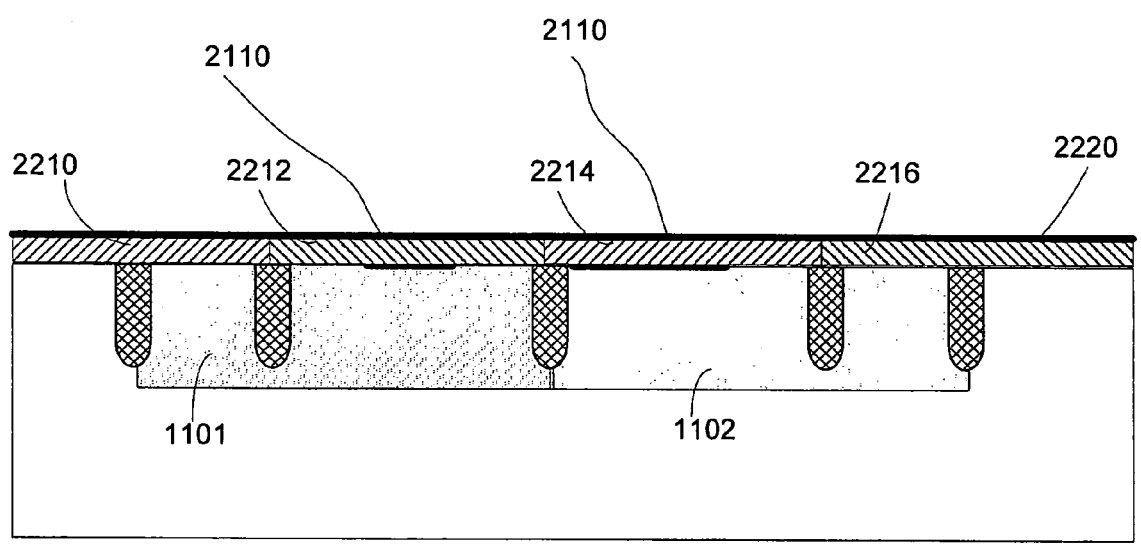

Next, a layer of polysilicon is deposited on the wafer as shown in FIG. 22. The polysilicon layer is covered by a protective layer of oxide marked as 2220. With photolithography to define certain regions on the wafer, a layer of photoresist is selectively removed from the wafer and the exposed areas are implanted with n-type and p-type dopants. This Figure shows the polysilicon layer with selectively doped regions. Region 2210 is doped p-type, region 2212 is doped n-type, region 2214 is doped p-type, and region 2216 is doped n-type. The parameters for doping these regions are the same as the parameters described in FIG. 13.

Figure 23:
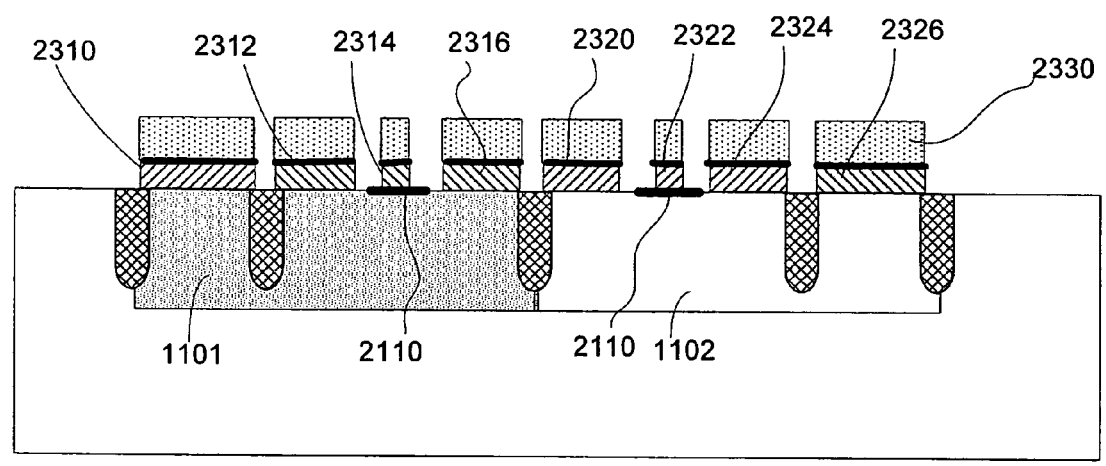

The next step is the definition of the gate and the remaining electrodes on polysilicon, as shown in FIG. 23. It is accomplished by first defining the pattern in a photoresist layer 2330. Next, using the photoresist layer as a mask, the polysilicon layer is etched to define the electrodes. Region 2310 forms the well tap of the NMOS, region 2312 forms the source of the NMOS, region 2314 forms the gate of the NMOS, region 2316 forms the drain of the NMOS, region 2324 forms the source of the PMOS, region 2322 forms the gate of the PMOS, region 2320 forms the drain region of the drain of the PMOS, and region 2326 forms the well tap for the PMOS. After etching the polysilicon layer, a short oxidation cycle is executed to form an oxide on the surface of silicon with a thickness between 20 Å and 500 Å. Additional heat cycles are executed to diffuse the dopants into the silicon from the polysilicon in the drain, source, and the well tap regions while controlling the diffusion of the dopants from the polysilicon into the gate dielectric and into the channel region.

Figure 24:
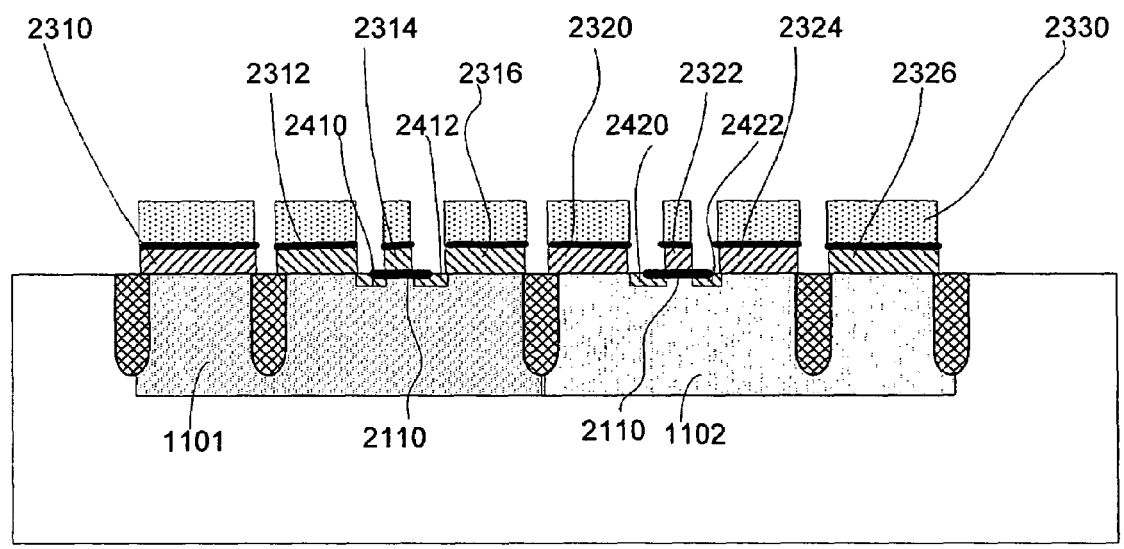

FIG. 24 shows the formation of the link between the source, drain, and channel regions by ion implantation. For NMOS, the links between the drain and the channel and the source and the channel are formed by ion implantation of n-type dopants marked as 2410 and 2412 respectively. For PMOS, the links between the source and the channel and the drain and the channel are formed by ion implantation of p-type dopants marked as 2420 and 2422 respectively. A rapid thermal anneal is carried out to activate the implant. The cross section of the wafer is very similar to the one shown in FIG. 17. The wafer is processed by the method described in FIGS. 17 through 20.

Figure 25:
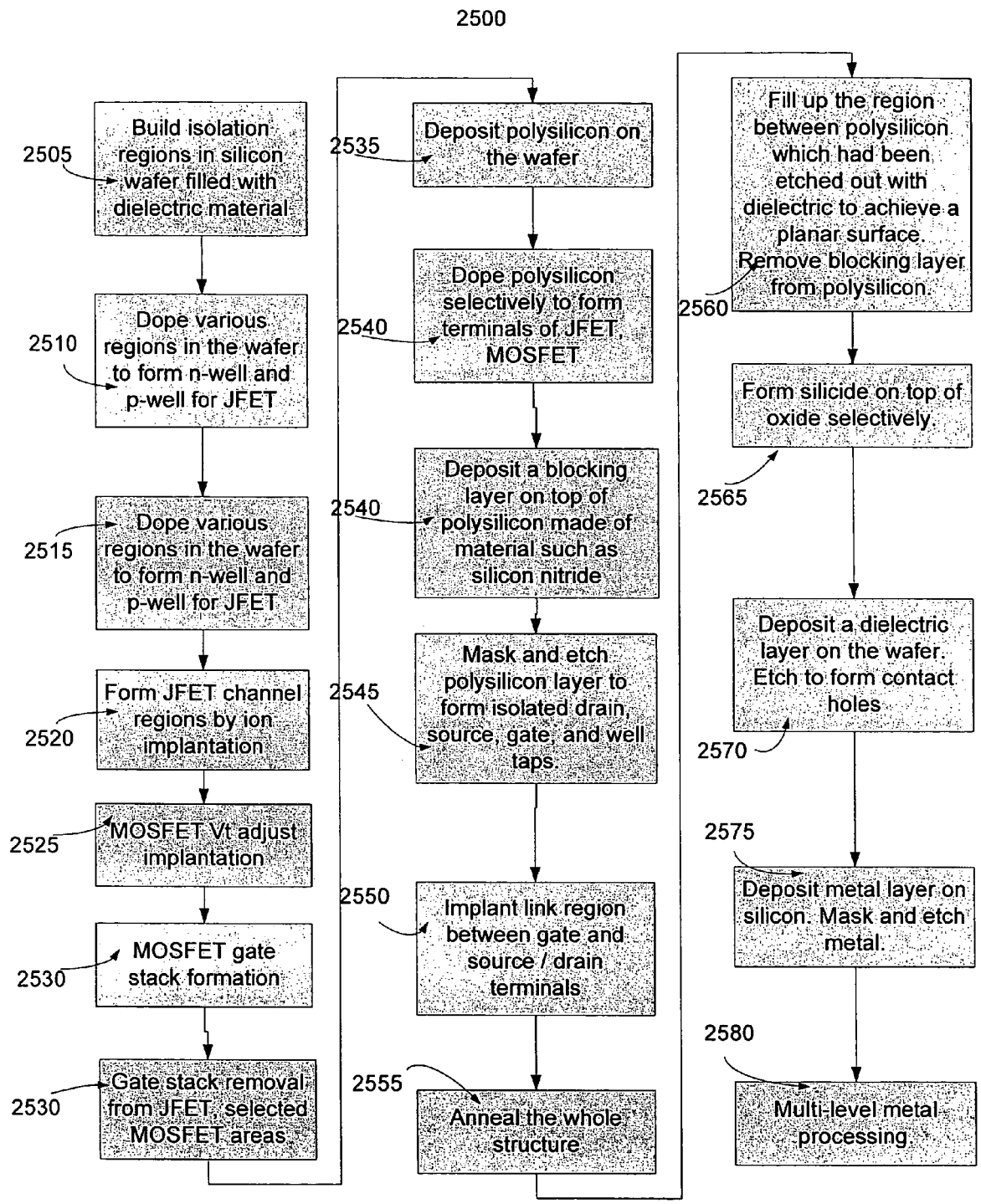
FIG. 25 shows the complete flow for forming JFETs and MOSFETs on the same wafer. Each step is further illustrated in FIG. 26-30.

The complete flow for forming JFETs and MOSFETs on the same wafer is shown in FIG. 25. The MOS transistors fabricated in this manner can have advantages over the known methods of building MOS transistors, as described here:

Known MOS transistors have a spacer which is used to separate the highly doped source/drain regions from the gate. The dimensions of the spacer are dependent upon the vertical polysilicon dimension and other processing parameters, and are not laterally scalable. The current embodiment of the MOS transistor uses lithography to separate the source/drain and the gate region, making this structure laterally scalable.

Known MOS transistors have a lightly doped source and drain region under the spacer, which limits the injection efficiency of the source, or the maximum current which can be controlled by the transistor. The current embodiment of the MOS transistor uses the link region as the source and drain junctions and it allows the doping of this region to be controlled independently.

Known MOS transistors have symmetrical source and drain regions. This embodiment allows asymmetrical source and drain junctions to be formed by spacing the source and drain polysilicon contacts from the gate asymmetrically.

Known MOS transistors have varying contact depths to the source/drain and the gate terminals; the contacts to the source/drain terminals are made directly to silicon while the contact to the gate terminal is made to polysilicon which is elevated from the source/drain junctions. This embodiment of MOS transistors etches all the contact holes to the polysilicon, keeping the depth of all the holes the same.

Known MOS transistors compromise the short channel performance due to limitations imposed by a shallow source/drain junction and the silicide formation on top of these junctions. This embodiment of the MOS transistors removes this limitation by placing the silicide on top of the polysilicon for all the junctions. Also, the shallow source/drain junction in the silicon is formed by diffusion of dopants from the polysilicon, which is a slower and more controllable process.

This method to build JFETs and MOSFETs allows a planar surface to exist prior to contact hole etch. It also insures that the amount of polysilicon removed is limited, which can be important in achieving a uniform plasma etch. It is well known that the variation in the density of the polysilicon pattern on the silicon wafer is responsible for variation in the etch rate of polysilicon. In this method, this problem can be overcome by the fact that the pattern density of polysilicon is much higher than in conventional process technology. Also, the contacts to the various junctions are separated by the polysilicon layer, which makes it extremely convenient to form shallow source and drain junctions.

Steps in FIG. 25 are further illustrated in FIG. 26-30.

Figure 26:
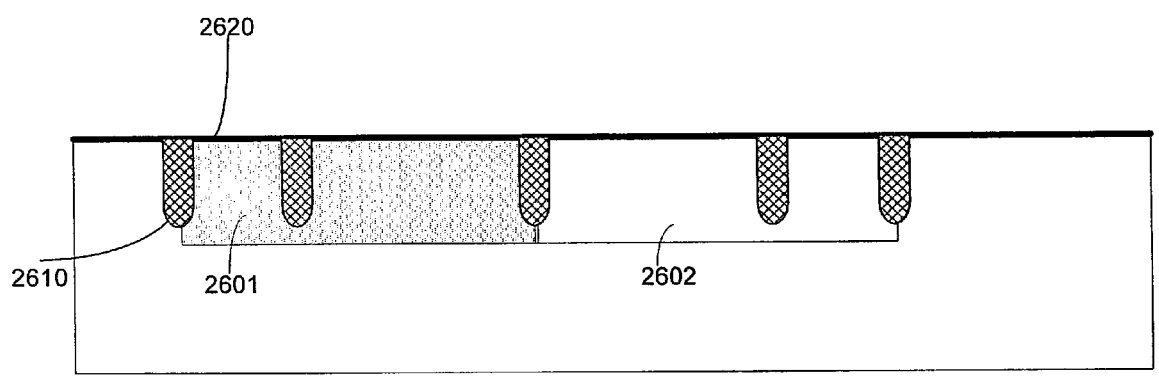
FIG. 26 shows the cross section of the silicon wafer after the n-well and the p-well have been formed.

FIG. 26 shows the cross section of a silicon wafer after the formation of isolation areas (2610), a p-well for forming NMOS transistors marked as 2601 and another p-well for forming nJFETs marked as 2602. Corresponding well structures to form PMOS transistors and pJFETs are also formed but are omitted here for the sake of brevity. After the $V_t$ adjust implants are performed in silicon for the MOS transistors, gate oxidation is performed over the whole wafer and a gate dielectric layer of appropriate thickness is grown on the wafer, ranging between 10 Å and 100 Å. It is shown as layer 2620 in this Figure. In alternate embodiments of the invention, the gate dielectric is formed with a high dielectric coefficient material such as hafnium silicate and similar materials known to those skilled in the art.

Figure 27:
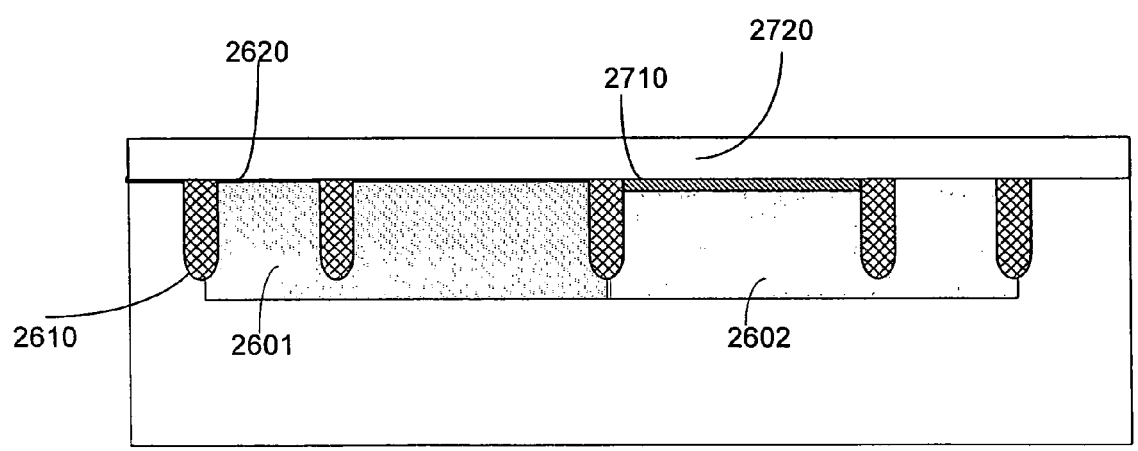
FIG. 27 shows the cross section of the silicon wafer after the channel for the JFET is formed.

FIG. 27 shows the wafer cross section after the following steps have been executed. First, the gate dielectric is removed by wet etching or a suitable technique such as plasma etching selectively from the regions where the JFET channel is to be formed. Next, the JFET channel is formed by ion implantation, marked as object 2710. After the formation of the channel, a layer of polycrystalline material is deposited on the wafer. It is marked as 2720.

The gate electrodes of the JFET and the MOS transistors are implanted with appropriate dopants. The gate regions of the NMOS transistor and the PJFET are doped heavily n-type with arsenic, phosphorus, or antimony. The gate electrode regions of the PMOS and the nJFET are implanted with p-type dopants, namely boron. The gate electrode regions are implanted with a heavy dose of the dopants in the range of $1\times10^{14}/cm^2$ to $1\times10^{16}/cm^2$. An alternate embodiment of the invention includes multiple implant steps for forming the gate electrode region of the MOS and JFET transistors. The wafer is heated to distribute the dopants throughout the polysilicon layer.

Figure 28:
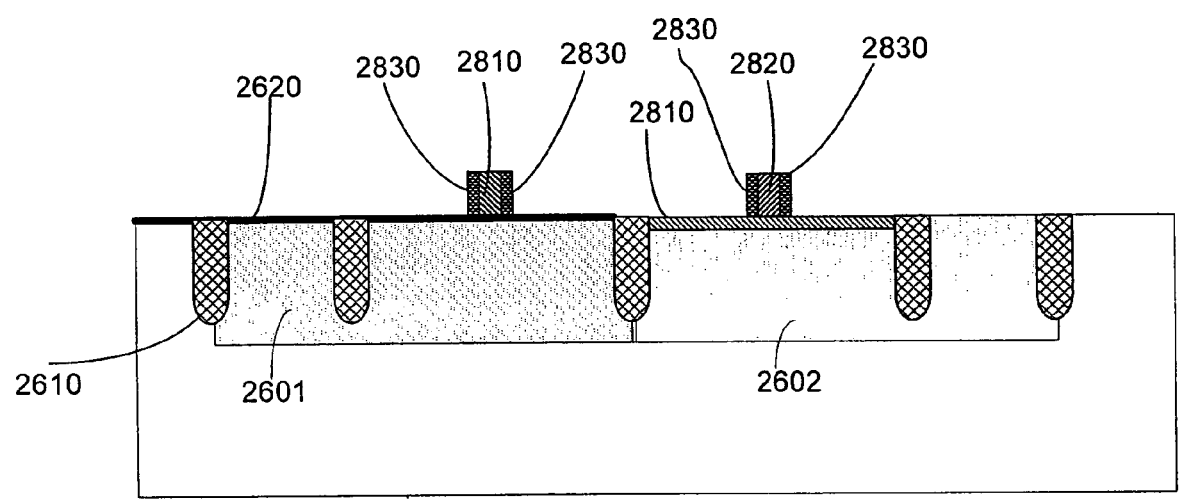
FIG. 28 shows the cross section of the silicon wafer after the channel for MOS is formed.

A photomask is put on the wafer and the layer of polysilicon is etched to define the gate electrodes for the transistors, as is shown in FIG. 28. Object 2810 forms the gate of the NMOS transistor while the object 2820 forms the gate electrode of the nJFET transistor. The gate of the NMOS transistor is formed with n-type polysilicon while the gate of the nJFET is formed with p-type polysilicon. After defining the gate, a short oxidation cycle is executed to remove the damage from the surface of polysilicon. Layers of oxide and nitride are deposited next and etched anisotropically to form spacers adjacent to the gate electrodes. At the end of the spacer formation, the cross section of the wafer shows a gate electrode surrounded by spacers on both sides. The objects marked 2830 are the spacers surrounding the gate. It should be noted here that the polysilicon on the nJFET islands (object 2602) does not have a layer of oxide underneath to stop the etch. So, the polysilicon etching process has to be conducted very carefully so as not to over-etch the polysilicon and etch into the silicon. Process steps to prevent over-etching the polysilicon have been described earlier in this application.

Figure 29:
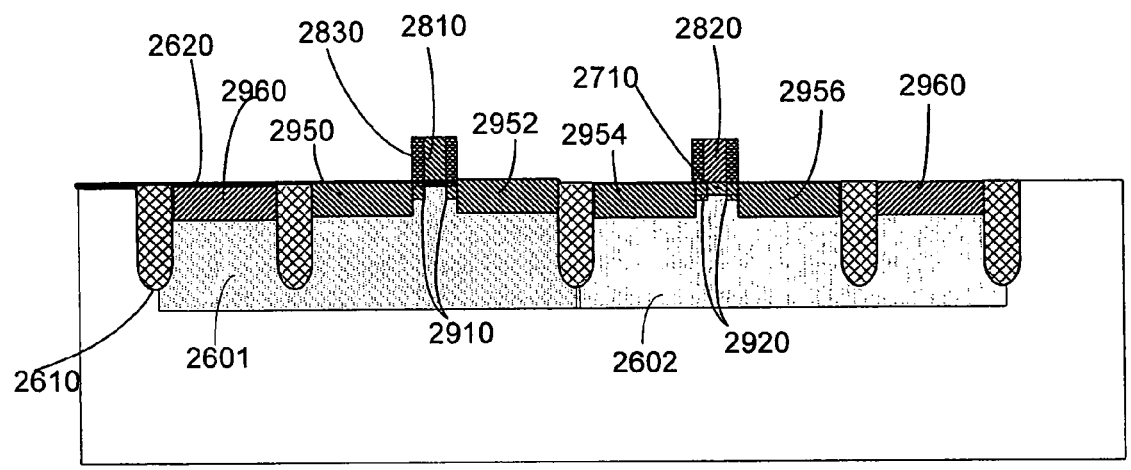
FIG. 29 shows the cross section of the silicon wafer after source and drain regions for MOS and JFET are formed.

FIG. 29 shows the cross section of the silicon wafer after the source and drain regions for the MOS and JFET transistors are formed. The process step consists of forming the Lightly Doped Drain (LDD) region for the NMOS transistors. This is done by selective ion implantation of n-type dopants in the NMOS region 2601. This step is also accompanied with an implant of dopant of opposite polarity (p-type) to prevent the depletion regions of drain and source from touching each other, causing a phenomenon known as "punch through". This step is known as the "anti-punch-through" implant. The LDD and the anti-punch-through implants are performed at angle of incidence on the wafer ranging from perfectly vertical to a tilt of 60% from the vertical. These regions are marked as 2910 in the FIG. 29. A similar process is performed to create a low resistance region (link) between the channel of the JFET and the source and drain regions. The links are formed adjacent to the gate of the JFET, marked as objects 2920. The source and drain regions are formed by ion implantation of n-type impurities for both NMOS and nJFET transistors. The n-type ion implantation to form source and drain terminals for NMOS is a well established process. For the nJFET, the doping type of source and drain is opposite to that of the gate. The implant parameters of the source and drain are adjusted to insure that the n-type dopants used for forming these terminals do not invert the polarity of the gate region. The gate doping for the JFET is maintained at a high level by implanting with n or p type dopants to a dose of $1\times10^{14}/cm^2$ to $1\times10^{16}/cm^2$. The energy of the implantation is selected based on the polysilicon thickness. The doping of the source and drain of the JFET is kept lower than the gate doping in order to insure that inversion of the gate doping does not occur. The source and drain regions of the NMOS transistor are marked as 2950 and 2952, and the source and drain of the nJFET are marked as 2954 and 2956, respectively.

Figure 30B:
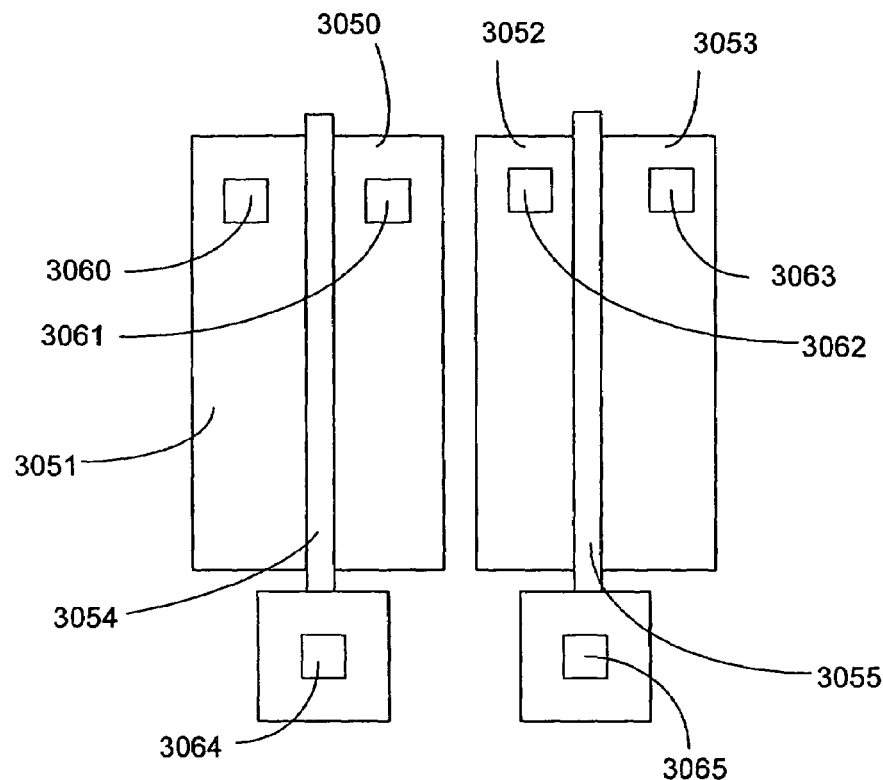
FIG. 30b shows the layout of the NMOS and nJFET after the contact holes and metal connections are formed.
Figure 30A:
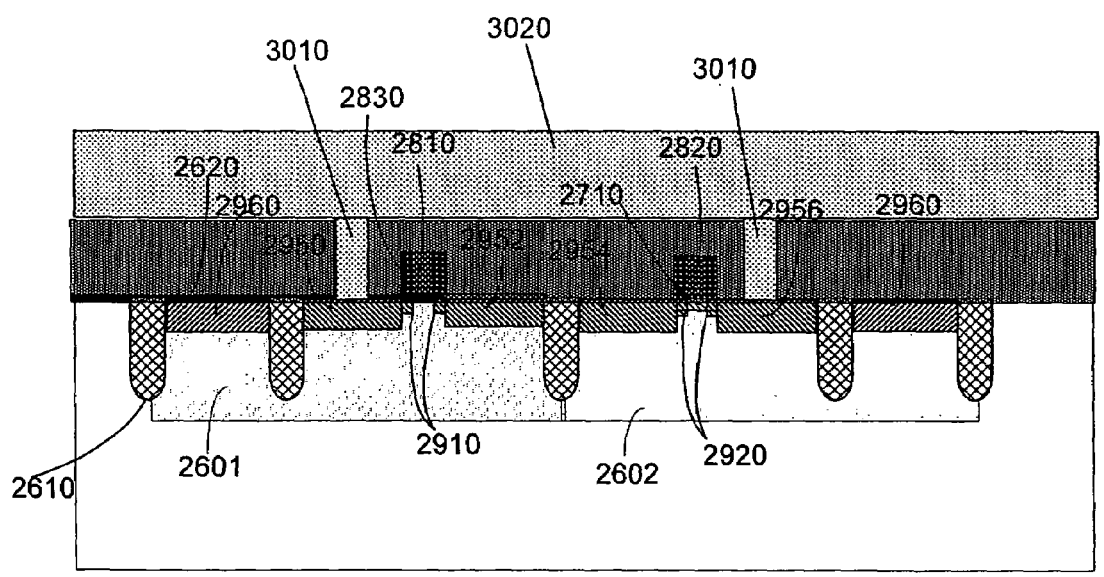
FIG. 30a shows the cross section of the silicon wafer after the contact holes and metal connections are formed.

FIG. 30a shows the cross section of the silicon wafer after contact holes and metal connections are formed. Following the source and drain formation, the self aligned silicide formation takes place by depositing a layer of metal such as cobalt, nickel, titanium, platinum, etc. and heating the wafer to allow the metal to react with the exposed silicon surface, forming the silicide compound. The unused metal is washed away by a wet chemical etch. This is followed by deposition of a layer of oxide at temperatures below 600 C as a dielectric layer to cover the whole wafer, as shown in FIG. 30a. Contact holes 3010 are etched in the dielectric layer. Metallic alloys in single or multiple layers are deposited over the wafer and they are patterned by a photolithographic process, followed by etching of the metal layer to form interconnects from the transistors shown as object 3020. The layout of the NMOS and nJFET is shown in FIG. 30b. The source, drain, and gate regions of the NMOS transistor are marked as 3051 and 3050, and 3054. Their respective contact holes are marked as 3060, 3061 and 3064. Similarly, source, drain, and gate regions of the nJFET are marked as objects 3052, 3053, and 3055, and their contact holes are marked as 3062, 3063, and 3065, respectively.

Exemplary embodiments provide numerous advantages described herein. For example, compatibility with MOS can be achieved in accordance with exemplary embodiments. An exemplary comparison of NFET and NMOS is shown below. This is based upon $T_{ox}$ of 10 Å for MOS; and Tdepletion of 720 Å for JFET (with corresponding channel doping $1\times10^{18}/cm^2$). This result in significant in input capacitance and related performance specifications, as shown in Table 1.

TABLE 1

|  | NFET | NMOS |
| --- | --- | --- |
| Ldrawn | 45 nm | 45 |
| Ion (uA/um) | 280 | 500 |
| C* (fF) | 0.06 | 1.5 |
| CV/I** (pS) | 0.27 | 3.1 |
| ½ CV2 (W) | 8.10E−18 | 7.77E−16 |

The gate region can have an impurity concentration doped from the gate electrode region.

In comparison to fabricating a MOS structure, the JFET structure can be manufactured with fewer processing steps. In addition to the elimination of the gate dielectric, the gate in a JFET can be fabricated by diffusing the dopants from polysilicon. Using a single critical masking step and simplified contact hole etch process (i.e., drop down to the same level), process complexity can be reduced. Furthermore, electron mobility enhancing technology developed for CMOS (e.g., strained lattice) can be applicable to the JFET devices disclosed herein.

In exemplary embodiments, the thickness of the depletion layer can be between about 100 Å to about 3000 Å during the application of the second voltage. The gate region can have a line-width of about 45 nm.

Figure 31:
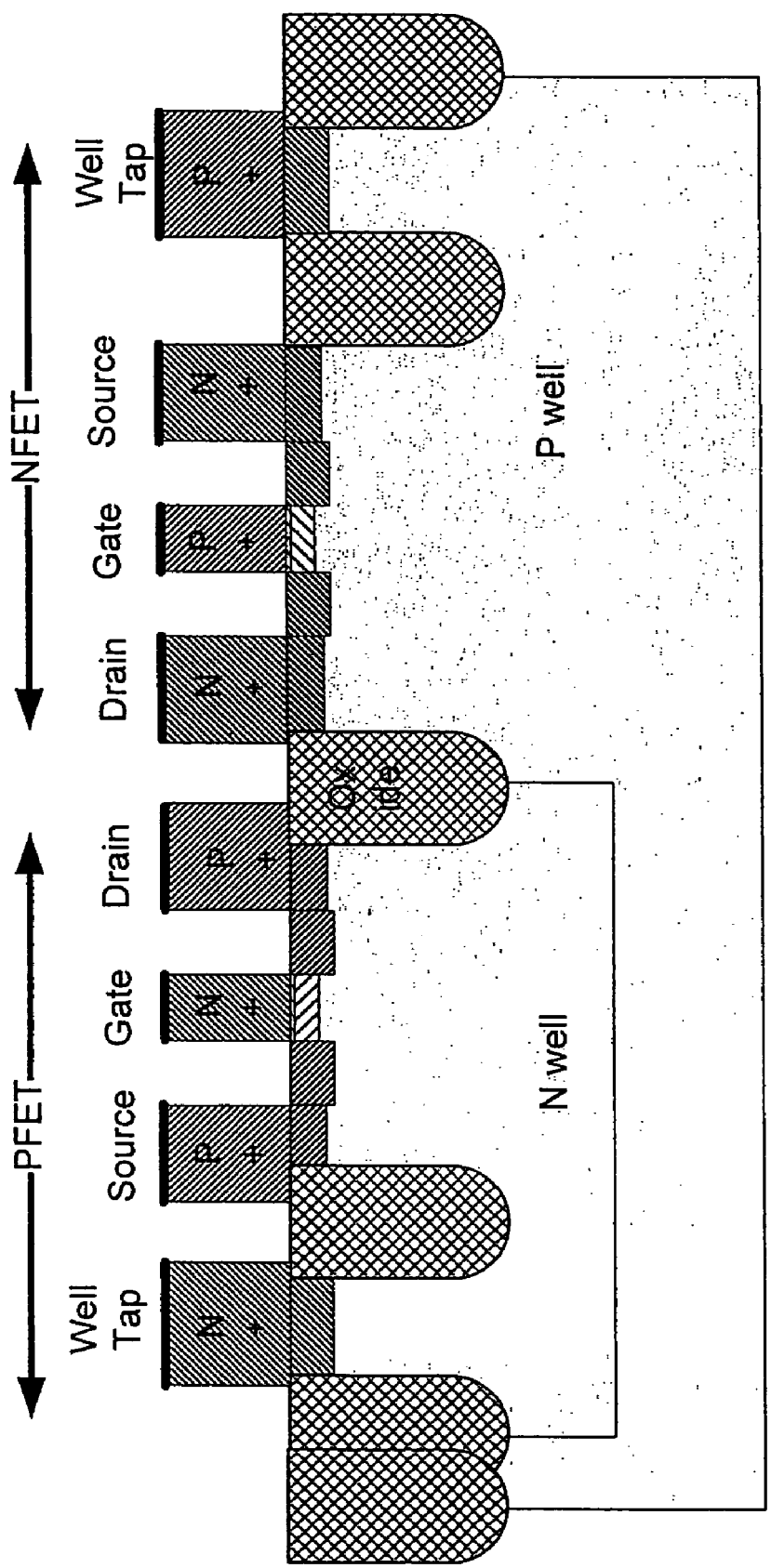
FIG. 31 shows an exemplary complementary poly FET or CFET.

In an exemplary embodiment, a first JFET can be configured adjacent to a second JFET, wherein the channel region of the first JFET is n-type and the channel region of the second JFET is p-type. FIG. 31 is an exemplary complementary FET (CFET), fabricated from two adjacent JFET devices previously described and embodied in FIGS. 3b and 5. FIG. 31 illustrates two adjacent device JFET devices, one with an n-type channel and the other with a p-type channel.

Various devices currently utilize CMOS technology, for example, static logic gates, dynamic logic gates, pass logic gates and memories. These devices can be fabricated by incorporating JFET technology as described herein. The JFET can be incorporated into any number of circuits and/or devices including, but not limited to a memory device such as an SRAM.

Figure 32:
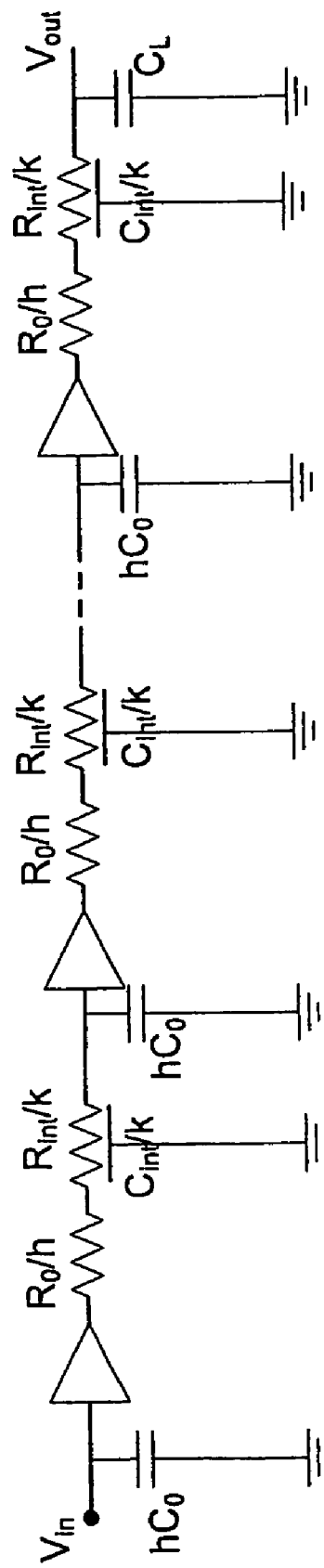
FIG. 32 shows an exemplary propagation delay associated with an exemplary repeater insertion configured using a transistor according to an exemplary embodiment described herein.

FIG. 32 shows an equivalent circuit to model the delay propagation delay associated with an exemplary repeater insertion configured using a JFET transistor as described in H. B. Bakoglu, Ph.D. Dissertation, Stanford University 1986, pp. 43-46.

In general, JFET devices with lower junction capacitance can reduce the propagation delay, in comparison to their CMOS counterparts. Propagation delay, $T_d$, can be computed from the following expression:

$$T_d = k\left[2.3\frac{R_0}{h}\left(\frac{C_{int}}{k} + hC_0\right) + \frac{R_{int}}{k}\left(\frac{C_{int}}{k} + 2.3hC_0\right)\right]$$

By setting $dTd/h=0$ and $dTd/dk=0$, yields:

$$T_d = 7.6\sqrt{(R_0 R_{int} C_0 C_{int})}$$

or $$T_d = Const.\sqrt{R_0} C_0$$

In other words, the $R_o C_o$ value for CFET exhibits an approximately ten-fold decrease or about a three-fold decrease in propagation delay.

Figure 33:
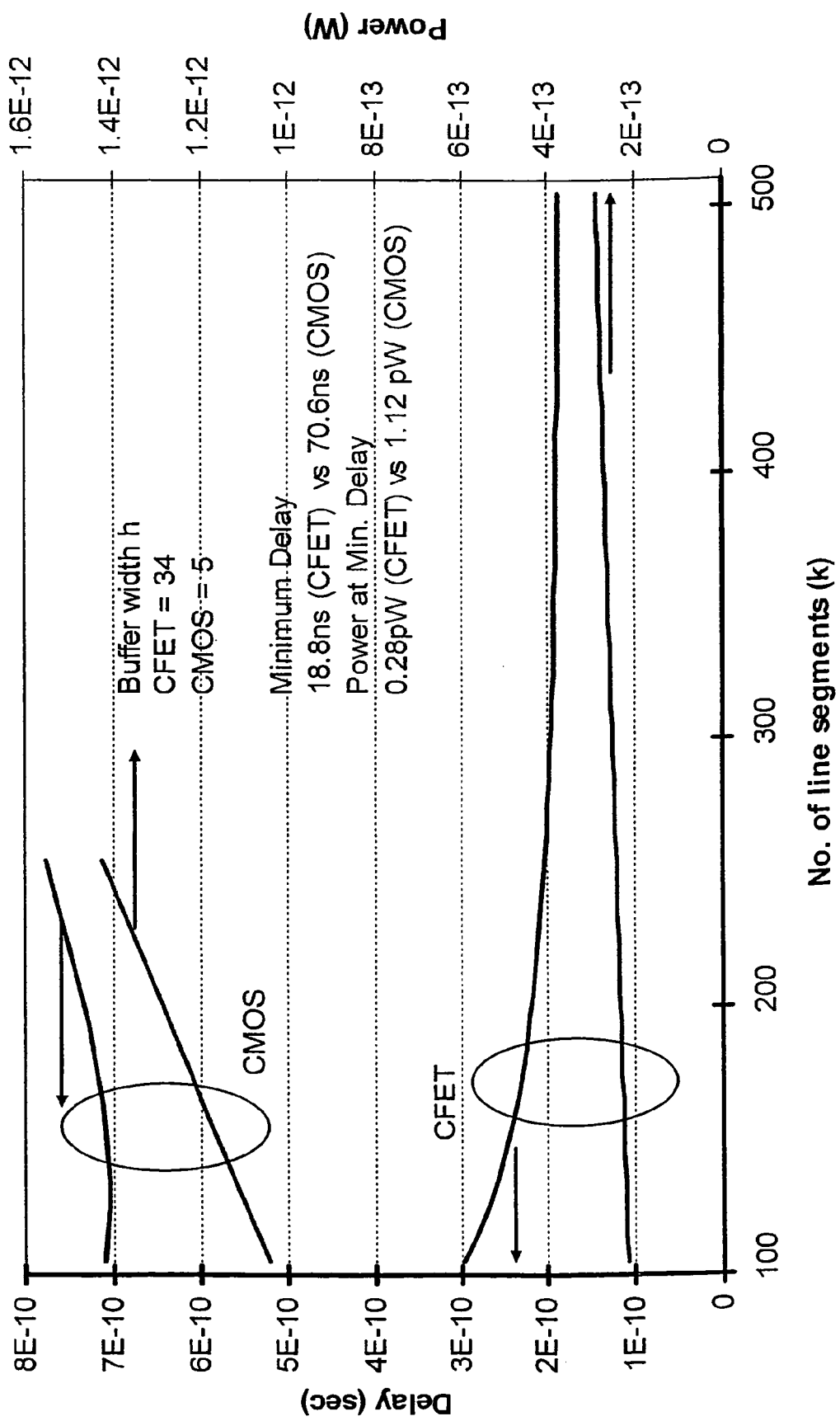
FIG. 33 shows an exemplary delay and power comparison associated with an exemplary CFET configured in accordance with an exemplary embodiment versus CMOS.
Figure 34:
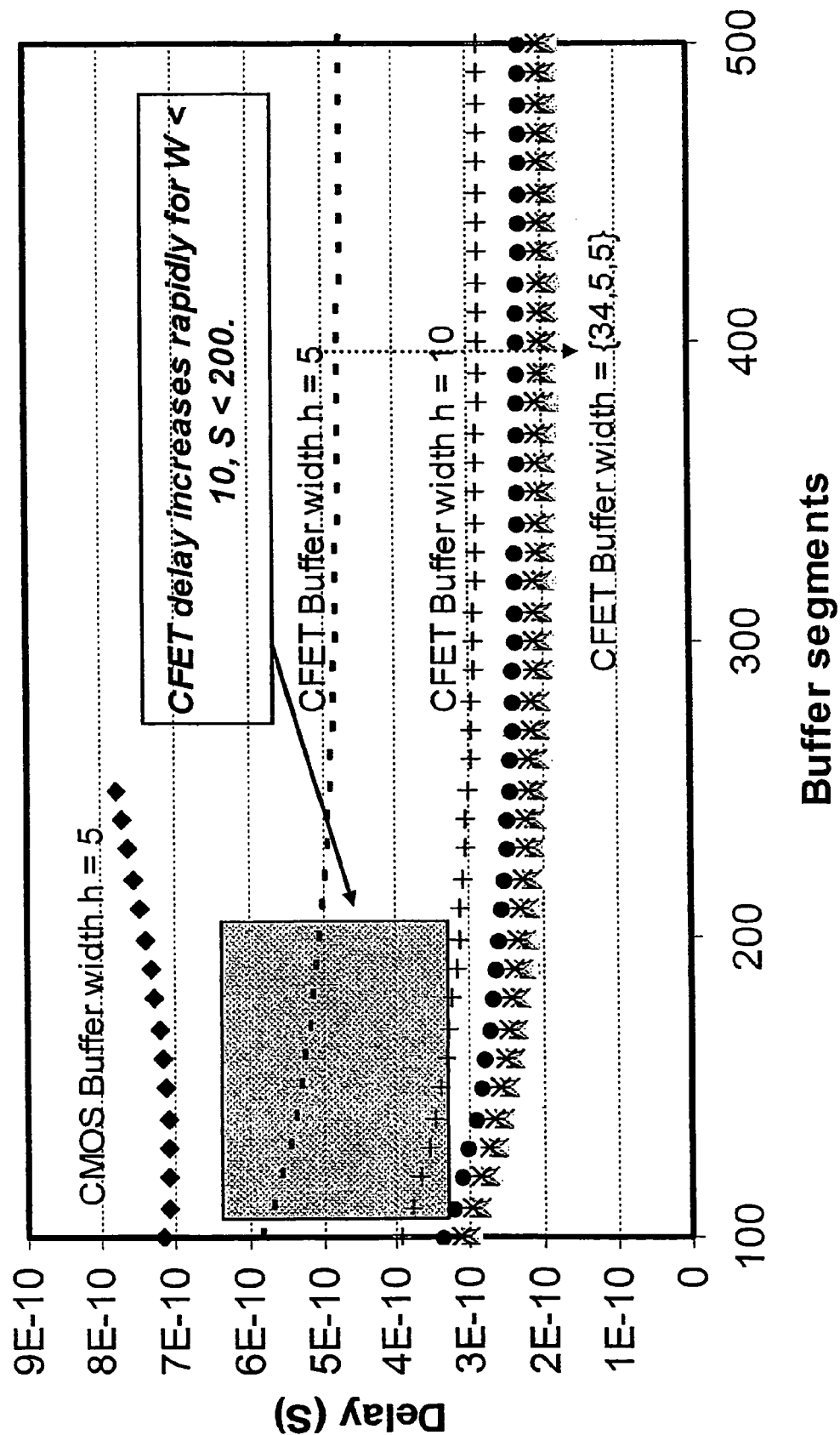
FIG. 34 shows an exemplary propagation delay for CFET versus CMOS versus buffer segments (width).

FIGS. 33 and 34 illustrate the propagation delay, in seconds, as a function of number of line segments k, and buffer segments, for both CFET and CMOS devices.

Furthermore, assuming:

$$k = \sqrt{\frac{R_{int} * C_{int}}{R_0 * C_0}}$$

$$h = \sqrt{\frac{R_0 * C_{int}}{R_{int} * C_0}}$$

$$Power = \frac{1}{2}C_{int}V_{dd}^2 + k*h*\frac{1}{2}*C_0*V_{dd}^2$$

and by substituting the expression for k and h into the expression describing power yields:

$$Power = \frac{1}{2}*C_{int}*V_{dd}^2 + \frac{1}{2}\sqrt{2.3}*C_{int}*V_{dd}^2$$

Thus, at optimal values of k and h, power is a function of $C_{int}$ only. In other words, power is independent of $C_o$. The above expressions are also described, by H. B. Bakoglu, Ph.D. Dissertation, Stanford University 1986, pp. 43-46, incorporated by reference in its entirety.

The following Table illustrates exemplary parameters of a CFET device versus those of a CMOS device for use in the exemplary FIG. 32 repeater:

| 45 nm Technology Node | CFET | CMOS |
|---|---|---|
| Global Wiring Line length (cm) | 1 | 1 |
| Rint (Ω) | 1.11E+04 | 1.11E+04 |
| Cint (pF) | 1.57E-12 | 1.57E-12 |
| R0 - Driver resistance (Ω-μm) | 5.38E+02 | 3.14E+02 |

-continued

| 45 nm Technology Node | CFET | CMOS |
|---|---|---|
| C0 - Driver Input Capacitance (F/μm) | 6.48E-17 | 1.55E-15 |
| h - Optimum buffer width (μm) | 34.3 | 5.3 |
| k - Optimum No. of segments | 466.8 | 124.8 |
| VDD (V) | 0.5 | 1 |

In alternate embodiments, where a plurality of JFET devices are configured in a repeater chain, a propagation delay is inversely proportional to a number of devices in the requester chain. In one example, the propagation delay can be less than 20 nanoseconds. Such a feature is illustrated in the FIG. 33 graph.

In alternate embodiments of a JFET device described herein, the channel region can include at least a layer of strained material. For example, the strained material can be a strained silicon.

The semiconductor substrate can be formed of at least one of Si, GaAs, InP or any III-V material.

Figure 35:
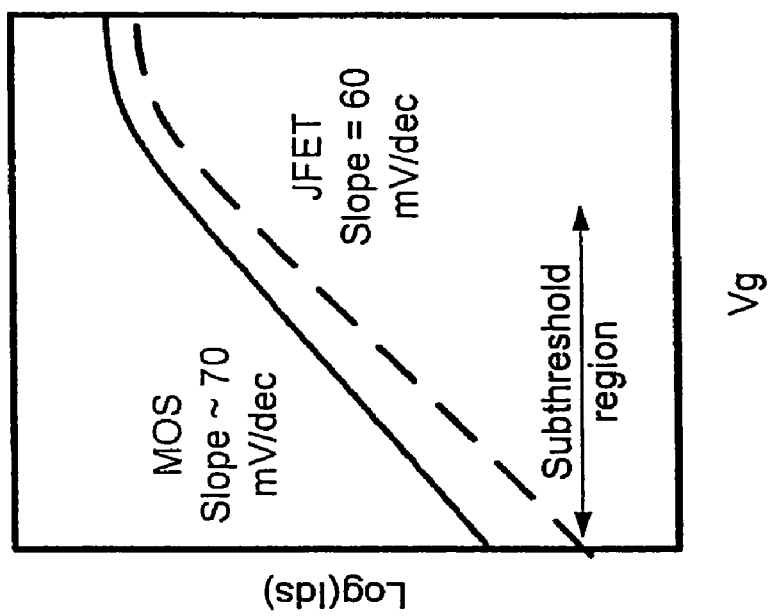
FIG. 35 shows an exemplary comparison sub-threshold conduction of JFET versus MOS.
Figure 36B:
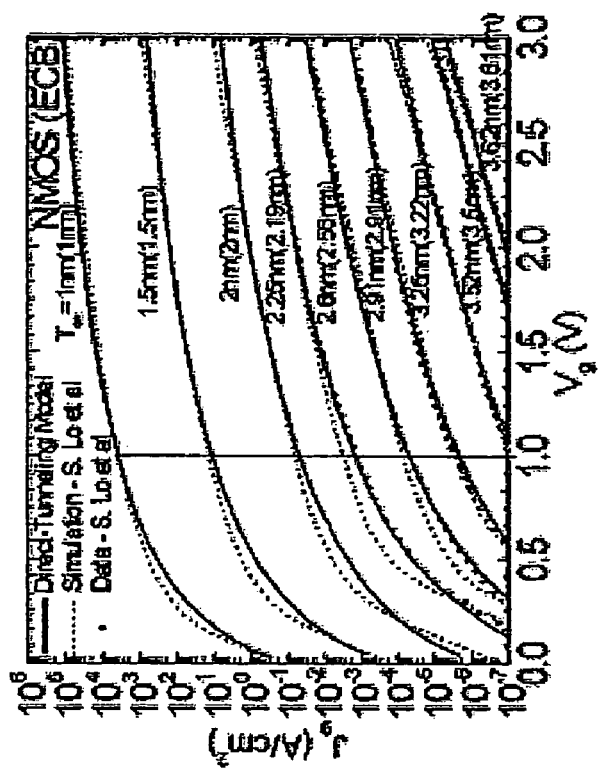
FIGS. 36a and 36b show a comparison of gate current in an NFET (FIG. 36a) versus NMOS (FIG. 36b).
Figure 36A:
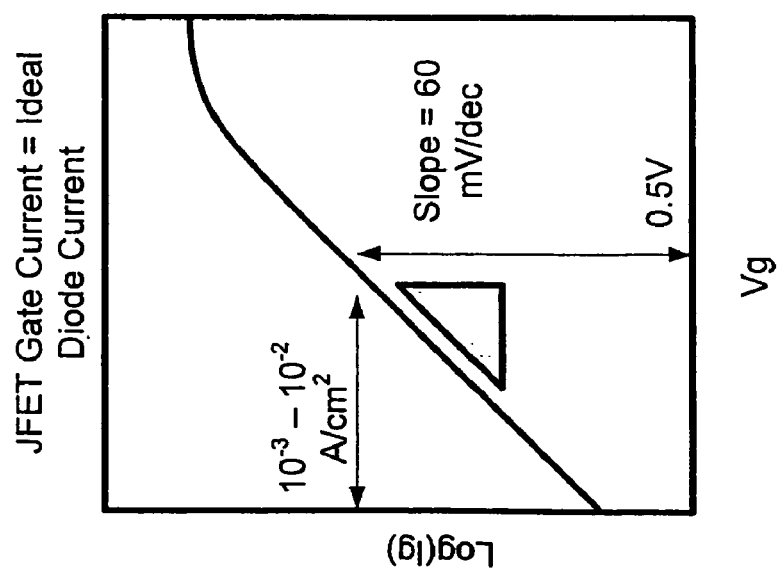

An advantage of an NFET device as described herein is reduced leakage current, in comparison to its NMOS counterpart, as illustrated in FIGS. 35 and 36. The total leakage current is a sum of the following components: the sub-threshold current ($I_{sub}$), the gate current ($I_g$) and junction tunneling current ($I_t$).

Transistors as described herein can, for example, be suitable for next generation telephone/PDA handsets having exemplary specifications as follows:

Power=0.1 W (idle)/5 W (active)
Chip area=1 cm2
Gate count=100 M
Clock=1 GHz
10% of the gates active at any time
Power per gate=500 nW
50% of the power dissipated as active power
Active power=250 nW=½ CV2

Fabrication of handsets with CMOS devices involve the following exemplary characteristics: $V_{dd}$=1.0 V, C=0.5 fF/gate and $C_{gate}$=1.5 fF/μm (state of the art). In contrast, exemplary fabrication of handsets with CFET, can be implemented with the following exemplary characteristics: $V_{dd}$=0.5 V, C=2.0 fF/gate and $C_{gate}$=0.06 fF/μm (state of the art).

The following illustrates exemplary parameters of a next generation handset:

Chip area=1 cm$^2$
Gate count=100 M
Clock=1 GHz
10% of the gates active at any time
  Active power=½ CV2●f●N●a, with f is as clock frequency, N as total number of gates, and a is activity factor
$C_{total}$/gate=3●co+8●H●cint
  H is the cell height (=20 F, feature size)
  $C_o$ is the input gate capacitance
  $C_{int}$ is the wire capacitance/micron (0.15 fF/μm)

100 M gates as configured with JFET transistors described herein can occupy 1 cm$^2$, where 1 gate occupies 1 μm$^2$, the feature size=0.045 nm and cell height H=22 F. Applying these parameters, a CMOS chip with Vdd=1.0 V, $C_{total}$=4.79 fF consumes 24.0 W of power. In contrast, a JFET chip as described herein with $V_{dd}$=0.5 V, $C_{total}$=1.63 fF consumes 2.0 W of power or exhibits a ten-fold decrease in power consumption. This beneficial characteristic can result in lower power dissipation and low chip/package temperature effects, and low leakage.

Figure 37:
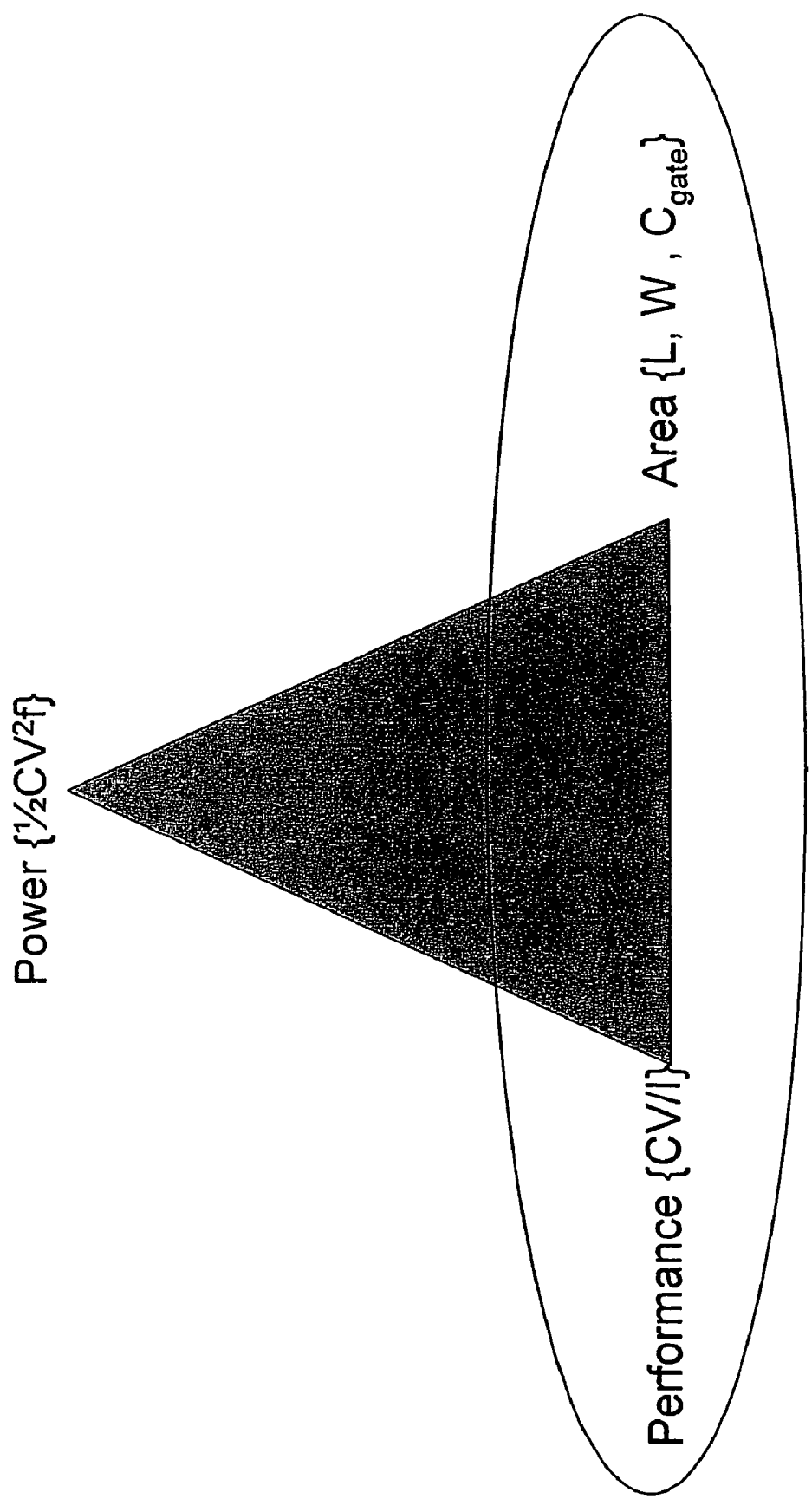
Figure 38:
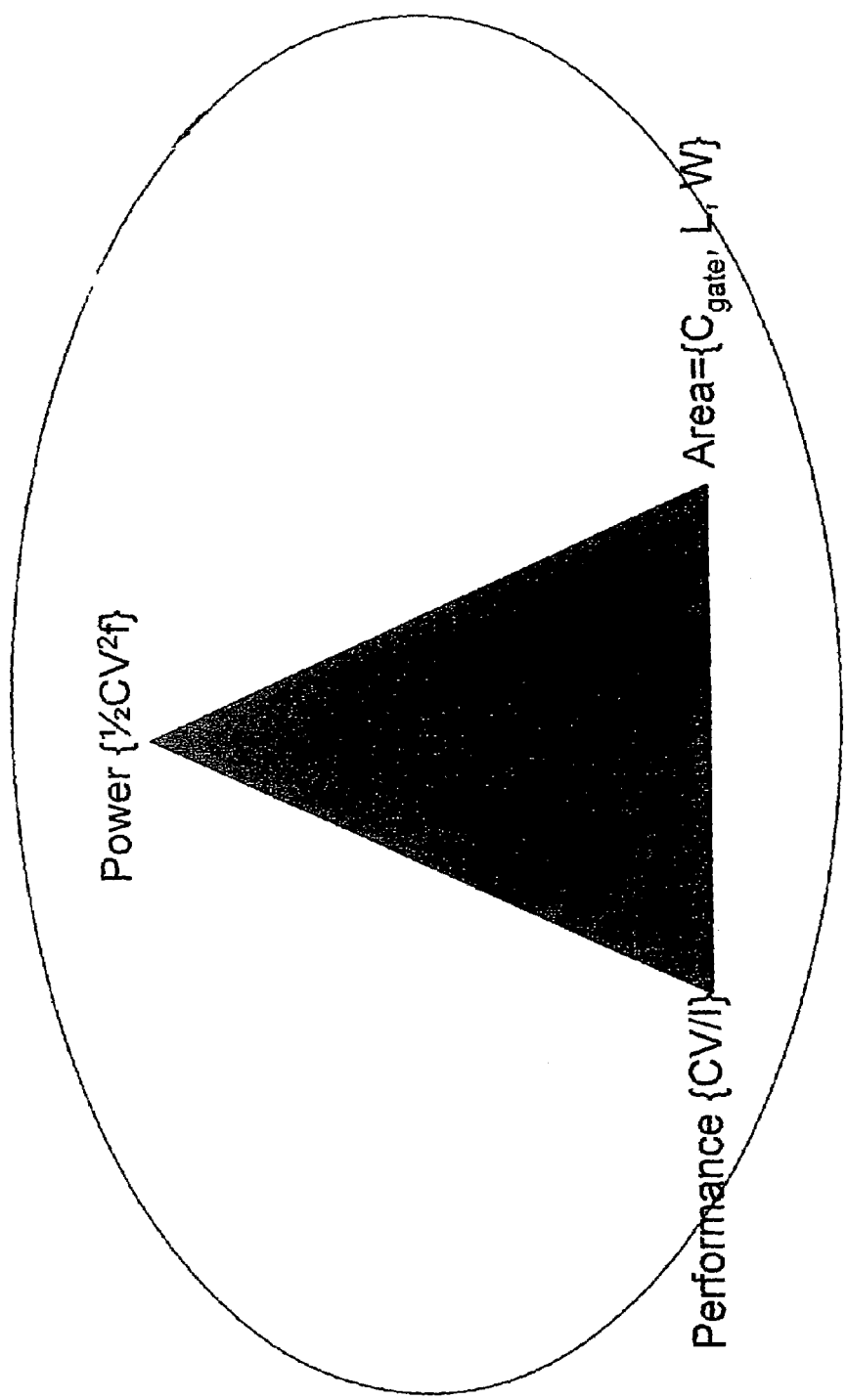
FIG. 38 shows an exemplary Figure of merit associated with a transistor configured in accordance with exemplary embodiments described herein.

As illustrated in FIGS. 37 and 38, for CMOS devices, the primary focus is on the fabrication of devices with the emphasis on performance, while minimizing area, rather than power consumption. However, the primary focus of JFET devices includes low power consumption, while maintaining an emphasis on performance and the minimization of area.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for using an inverter with a pair of complementary junction field effect transistors (CJFET) with a small linewidth, the method comprising the steps of:
    having an input capacitance for said CJFET inverter to be less than the corresponding input capacitance of a CMOS inverter of similar linewidth;
    operating at a power supply with a lesser value than the voltage drop across a forward-biased diode;
    having a reduced switching power as compared to said CMOS inverter; and
    having a propagation delay for said CJFET inverter that is at least comparable to the corresponding delay of said CMOS inverter.

2. The method in claim 1, wherein, as compared to said CMOS inverter, said CJFET inverter is less subject to various electrical degradation mechanism.

3. The method in claim 2, wherein said various electrical degradation mechanism comprising a gate oxide degradation.

4. The method of claim 2, wherein said various electrical degradation mechanism comprising an electrostatic discharge phenomena.

5. The method in claim 1, wherein said small linewidth is less than 100 nm.

6. The method in claim 1, wherein said small linewidth is less than 45 nm.

7. The method in claim 6, wherein said CJFET inverter has a lesser gate current as compared to the corresponding gate current of said CMOS inverter built with conventional gate dielectric.

8. The method in claim 7, wherein said lesser CJFET gate current is more than ten times lower than the corresponding CMOS current.

9. The method in claim 1, wherein said power supply is about 0.5 Volt or below.

10. The method in claim 1, wherein said propagation delay is at least three times less than a corresponding delay of said CMOS inverter.

11. The method in claim 1, wherein said CJFET inverter further comprising a first junction field transistor (JFET1) adjacent, within the same semiconductor substrate, to a second junction field transistor (JFET2), wherein:
    said JFET1 has a n-type channel region and said JFET2 has a p-type channel region.

12. The method in claim 11, wherein said JFET1 is formed within a p-type well region and said JFET2 formed within in a n-type well region.

13. The method in claim 12, wherein said p-type and n-type well regions are embedded in said same semiconductor substrate.

14. The method in claim 13, wherein said n-type well region is further embedded into said p-type well region.

15. The method in claim 14, wherein said JFET1 and said JFET2 each further comprising a gate region located between the appropriate source and drain regions of the corresponding JFET transistors; and all well, gate, source and drain regions are being embedded into said same semiconductor substrate.

16. The method of claim 1, further comprising:
    biasing a well voltage of the CJFET to reduce power supply leakage current.

* * * * *